US012082499B2

(12) United States Patent
Xiao et al.

(10) Patent No.: US 12,082,499 B2
(45) Date of Patent: Sep. 3, 2024

(54) COMPOUND AND ITS APPLICATION

(71) Applicants: WUHAN TIANMA MICRO-ELECTRONICS CO., LTD., Wuhan (CN); WUHAN TIANMA MICROELECTRONICS CO., LTD. SHANGHAI BRANCH, Shanghai (CN)

(72) Inventors: Wenjing Xiao, Shanghai (CN); Wei Gao, Shanghai (CN); Wenpeng Dai, Shanghai (CN); Lei Zhang, Shanghai (CN); Jinghua Niu, Shanghai (CN); Yi Liu, Shanghai (CN)

(73) Assignees: WUHAN TIANMA MICRO-ELECTRONICS CO., LTD., Wuhan (CN); WUHAN TIANMA MICROELECTRONICS CO., LTD. SHANGHAI BRANCH, Shanghai (CN)

( * ) Notice: Subject to any disclaimer, the term of this patent is extended or adjusted under 35 U.S.C. 154(b) by 527 days.

(21) Appl. No.: 16/831,646

(22) Filed: Mar. 26, 2020

(65) Prior Publication Data

US 2020/0227648 A1 Jul. 16, 2020

(30) Foreign Application Priority Data

Sep. 29, 2019 (CN) ......................... 201910936377.0

(51) Int. Cl.

| | |
|---|---|
| ***H10K 85/60*** | (2023.01) |
| ***C07F 9/6568*** | (2006.01) |
| ***C09K 11/06*** | (2006.01) |
| ***H10K 50/11*** | (2023.01) |
| ***H10K 50/15*** | (2023.01) |
| ***H10K 50/16*** | (2023.01) |
| ***H10K 50/17*** | (2023.01) |
| ***H10K 50/18*** | (2023.01) |
| ***H10K 101/10*** | (2023.01) |

(52) U.S. Cl.

CPC ....... *H10K 85/657* (2023.02); *C07F 9/65685* (2013.01); *C09K 11/06* (2013.01); *H10K 85/636* (2023.02); *H10K 85/6572* (2023.02); *C09K 2211/1018* (2013.01); *H10K 50/11* (2023.02); *H10K 50/15* (2023.02); *H10K 50/16* (2023.02); *H10K 50/17* (2023.02); *H10K 50/171* (2023.02); *H10K 50/18* (2023.02); *H10K 2101/10* (2023.02)

(58) Field of Classification Search

CPC ............. H01L 51/0071; H01L 51/0061; H01L 51/0072; H01L 51/5012; H01L 51/5016; H01L 51/5056; H01L 51/5072; H01L 51/5088; H01L 51/5092; H01L 51/5096; H01L 2251/308; H01L 51/0058; H01L 51/0068; C07F 9/65685; C07F 9/5728; C09K 11/06; C09K 2211/1018; C09K 2211/1007; C09K 2211/1011; C09K 2211/1014; C09K 2211/1029; C09K 2211/1033; C09K 2211/1037; C09K 2211/104; C09K 2211/1092; C09K 2211/1096; H10K 85/657; H10K 85/636; H10K 85/6572; H10K 50/11; H10K 50/15; H10K 50/16; H10K 50/17; H10K 50/171; H10K 50/18; H10K 2101/10; H10K 2102/103; H10K 85/626; H10K 85/655

See application file for complete search history.

(56) References Cited

U.S. PATENT DOCUMENTS

| | | | | |
|---|---|---|---|---|
| 2004/0124766 A1* | 7/2004 | Nakagawa | H01L 51/0064 | 313/506 |
| 2008/0220285 A1* | 9/2008 | Vestweber | C07C 49/792 | 564/426 |
| 2018/0076396 A1* | 3/2018 | Lee | C07D 221/18 | |
| 2018/0331300 A1* | 11/2018 | Fadhel | H01L 51/0071 | |
| 2019/0006589 A1* | 1/2019 | Senkovskyy | C07F 9/65685 | |

FOREIGN PATENT DOCUMENTS

| | | | |
|---|---|---|---|
| CN | 101747373 A | | 6/2010 |
| CN | 111574565 A | * | 8/2020 |
| WO | WO-2014037077 A1 | * | 3/2014 |

OTHER PUBLICATIONS

Machine translation for CN 111574565 A (publication date Aug. 2020). (Year: 2020).*

Chemical Communications, (2016), 52(11), pp. 2374-2377. (Year: 2016).*

Stolar, M., & Baumgartner, T. (2014). Phosphorus-Containing Materials for Organic Electronics. Chemistry—An Asian Journal, 9(5), 1212-1225. (Year: 2014).*

Bruch et al., "Bis (phosphoryl)-Bridged Biphenyls by Radical Phosphanylation: Synthesis and Photophysical and Electrochemcial Properties," Communications, Angew. Chem. Int. Ed. 2011, 50, 12094-12098, Wiley online library.

* cited by examiner

*Primary Examiner* — Dawn L Garrett
(74) *Attorney, Agent, or Firm* — ALSTON & BIRD LLP

(57) ABSTRACT

An organic compound has a structure as shown in Formula (I). The compound has a phosphorus-oxygen five-membered ring combined with a five-membered ring as an electron acceptor unit. The compound has a high luminous efficiency and a lower material cost than phosphorescent metal complexes. The compound can be built into a stack structure of organic optoelectronic device, such as OLED. The resultant organic optoelectronic device includes an anode, a cathode, and at least one organic thin film located between the anode and the cathode, the organic thin film contains the compound as shown in Formula (I).

15 Claims, 1 Drawing Sheet

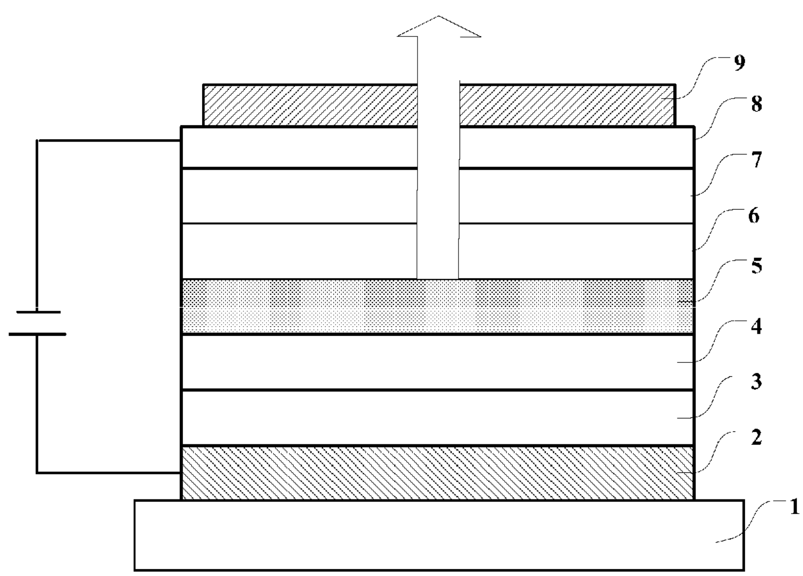
9
8
7
6
5
4
3
2
1

COMPOUND AND ITS APPLICATION

CROSS-REFERENCE TO RELATED APPLICATIONS

The application claims the benefit of the earlier filing date of Chinese Patent Application No. CN201910936377.0, filed on Sep. 29, 2019 to the China National Intellectual Property Administration, the contents of which are incorporated by reference herein in its entirety.

TECHNICAL FIELD

The present disclosure relates to the technical field of organic electroluminescence technology, in particular, relates to a compound and its application in OLED.

BACKGROUND

Organic Light-Emitting Diode (OLED), also known as Organic Electroluminesence EL, Organic Light-emitting Semiconductor, is a current-type organic light-emitting device, which involves a phenomenon of luminescence caused by current-carrier injection and recombination. The luminous intensity is proportional to the injected current. When the OLED is under the action of electric field, the holes generated by the anode and the electrons generated by the cathode will move, be injected into the hole transport layer and the electron transport layer, respectively, and then migrate to the light-emitting layer. When the holes and electrons recombine in the light-emitting layer, energy excitons are generated, thereby exciting the light-emitting molecules to in turn generate visible light.

According to the light-emitting mechanism, the materials that can be used in the OLED light-emitting layer mainly include fluorescent materials, phosphorescent materials, triplet-triplet annihilation (TTA) materials, and thermally activated delayed fluorescent (TADF) materials.

The singlet excited state $S_1$ of fluorescent materials return to the ground state $S_0$ through radiative transition. The triplet excited state $T_1$ of fluorescent materials is forbidden to return to the ground state $S_0$ through radiative transition. According to the spin statistics, the ratio of singlet and triplet excitons among the excitons is 1:3, so that the maximum internal quantum yield of fluorescent materials does not exceed 25%. According to the Lambertian luminous mode, the light extraction efficiency is about 20%, so that the equivalent quantum efficiency (EQE) of OLED devices from fluorescent materials does not exceed 5%.

The triplet excited state $T_1$ of the phosphorescent materials attenuate to the ground state $S_0$ through direct radiation. Due to the heavy atom effect, phosphorescent materials can strengthen the intramolecular intersystem crossing through the spin coupling, and can directly use 75% triplet excitons to achieve the co-participated emission of $S_1$ and $T_1$ at room temperature, and the theoretical maximum internal quantum yield can reach 100%. However, phosphorescent materials are substantial complexes of heavy metals such as Ir, Pt, Os, Re, and Ru, etc. The production cost thereof is high, which is not conducive to large-scale production. Under high current density, there is a serious efficiency roll-off phenomenon of the phosphorescent materials, meanwhile the stability of the phosphorescent device is not good.

Two of the triplet excitons of TTA material interact and produce one singlet exciton, which returns to the ground state $S_0$ through the radiative transition, and the theoretical maximum internal quantum yield can only reach 62.5%. In order to prevent a greater efficiency roll-off phenomenon, the concentration of triplet excitons during this process needs to be adjusted.

In the TADF materials, when the energy gap value of the $S_1$ state and the $T_1$ state is small and the excitons in $T_1$ state have longer lifetime, under certain temperature conditions, the reverse intersystem crossing (RISC) of the $T_1$ state excitons may occur to achieve the $T_1 \rightarrow S_1$ process, and then the radiation attenuate from $S_1$ state to the ground state $S_0$ may occur. Since energy level difference between singlet excited state and triplet excited state is relatively small, in the reverse intersystem crossing occurring inside the molecule, $T_1$ state excitons can up-switch to $S_1$ state by absorbing environmental heat, 75% of triplet state excitons and 25% of single state excitons can be used at the same time, and the theoretical maximum internal quantum yield can reach 100%. It involves mainly organic compounds which do not require rare metal elements, and production cost is low. Chemical modification by various methods is possible.

However, less TADF materials have been found so far, and the performance cannot meet the needs of existing devices. Therefore, there is still a need to develop new, efficient TADF materials that can be used in OLED devices.

SUMMARY

In view of the deficiencies described above, one embodiment of the present disclosure is to provide a compound. The compound is a bipolar material and has high luminous efficiency, which can improve the luminous efficiency of an organic photoelectric device, and the compound has a lower cost than phosphorescent metal complexes.

The embodiment provides a compound having a structure as shown in Formula (I):

Formula (I)

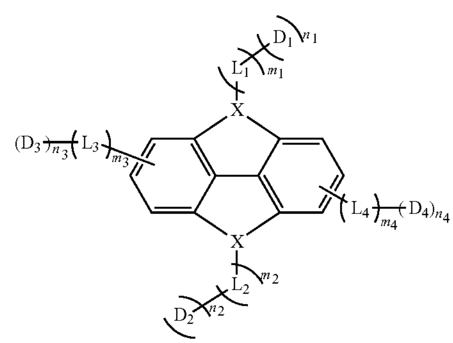

In Formula (I), the X is selected from P═O;

the $L_1$ and $L_2$ are each independently selected from any one of a single bond, a substituted or unsubstituted C6-C40 (e.g., C10, C12, C14, C16, C18, C20, C26, C28, C30, and C60, etc.) aryl or arylene group, a substituted or unsubstituted C3-C40 (e.g., C6, C10, C12, C14, C16, C18, C20, C26, C28, C30, and C60, etc.) heteroaryl or heteroarylene group; and $D_1$ and $D_2$ that are connected to $L_1$ or $L_2$ respectively can be present or absent. In case $D_1$ or $D_2$ is present, arylene group or heteroarylene group is formed; otherwise, aryl group or heteroaryl group is formed. The same rule is applied to $L_3$ and $L_4$.

In Formula (I), $L_3$ and $L_4$ are each independently selected from any one of a single bond, a hydrogen atom, a substituted or unsubstituted C6-C40 (e.g., C10, C12, C14, C16, C18, C20, C26, C28, C30, and C60, etc.) aryl or arylene group, a substituted or unsubstituted C3-C40 (e.g., C6, C10, C12, C14, C16, C18, C20, C26, C28, C30, and C60, etc.) heteroaryl or heteroarylene group; $D_1$, $D_2$, $D_3$ and $D_4$ are each independently selected from any one of a substituted or unsubstituted C6-C40 (e.g., C10, C12, C14, C16, C18, C20, C26, C28, C30, and C60, etc.) aryl group, a substituted or unsubstituted C4-C40 (e.g., C6, C10, C12, C14, C16, C18, C20, C26, C28, C30, and C60, etc.) heteroaryl group, a substituted or unsubstituted C6-C40 (e.g., C10, C12, C14, C16, C18, C20, C26, C28, C30, and C60, etc.) arylamine group, and $D_1$, $D_2$, $D_3$ and $D_4$ are all electron-donating groups; $n_1$, $n_2$, $n_3$ and $n_4$ are each independently 0 or 1, and at least one of the $n_1$, $n_2$, $n_3$ and $n_4$ is 1; $m_1$, $m_2$, $m_3$ and $m_4$ are each independently 0 or 1.

When a substituent is present in the above group, the substituent typically includes any one or a combination of at least two of cyano, halogen, phenoxy, C1-C20 (e.g., C2, C3, C4, C5, C6, C7, C8, C9, C10, C15, C18, etc.) alkyl group, C1-C20 (e.g., C2, C3, C4, C5, C6, C7, C8, C9, C10, C15, C18, etc.) alkoxyl group, C6-C40 (e.g., C10, C12, C14, C16, C18, C20, C26, C28, C30, C60, etc.) aryl group, C4-C40 (e.g., C6, C10, C12, C14, C16, C18, C20, C26, C28, C30, C60, etc.) heteroaryl group, and C6-C40 (e.g., C10, C12, C14, C16, C18, C20, C26, C28, C30, C60, etc.) arylamine group. The "substituted or unsubstituted" group may be substituted with one substituent or multiple substituents. When there are multiple substituents, they may be selected from different substituents, and the substituents of $L_1$, $L_2$, $L_3$ and $L_4$ do not include halogen and cyano, and are generally aryl or heteroaryl.

A second embodiment of the current disclosure is to provide a way of fabricating the compound in an organic photoelectric device.

A third embodiment of the present disclosure is to provide an organic photoelectric device including this compound.

The organic photoelectric device includes an anode, a cathode, and at least one organic thin film located between the anode and the cathode.

BRIEF DESCRIPTION OF THE DRAWINGS

The FIGURE is a schematic diagram of an organic photoelectric device provided in one embodiment of the present disclosure.

DETAILED DESCRIPTION

To facilitate the understanding of the present disclosure, the following embodiments are listed below in the present disclosure. It will be apparent to those skilled in the art that the embodiments are merely illustrations of the present disclosure for facilitating the understanding of the present disclosure and should not be construed as specific limitations to the present disclosure.

One embodiment according to the disclosure is to provide a compound, which when used in an organic photoelectric device enables the device to have higher luminous efficiency and reduce the cost at the same time.

The present disclosure provides a compound having a structure as shown in Formula (I):

Formula (I)

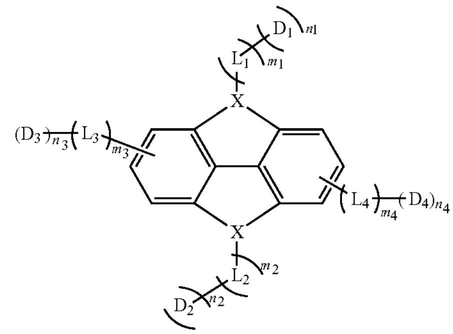

In Formula (I), the X is selected from P═O;

In Formula (I), the $L_1$ and $L_2$ are each independently selected from any one of a single bond, a substituted or unsubstituted C6-C40 (e.g., C10, C12, C14, C16, C18, C20, C26, C28, C30, and C60, etc.) aryl or arylene group, a substituted or unsubstituted C3-C40 (e.g., C6, C10, C12, C14, C16, C18, C20, C26, C28, C30, and C60, etc.) heteroaryl or heteroarylene group;

$D_1$ and $D_2$ that are connected to $L_1$ and $L_2$ respectively can be present or absent. If present, we get arylene group and heteroarylene group; otherwise, we get aryl group and heteroaryl group. The same applies to $L_3$ and $L_4$.

In Formula (I), the $L_3$ and $L_4$ are each independently selected from any one of a single bond, a hydrogen atom, a substituted or unsubstituted C6-C40 (e.g., C10, C12, C14, C16, C18, C20, C26, C28, C30, and C60, etc.) aryl or arylene group, a substituted or unsubstituted C3-C40 (e.g., C6, C10, C12, C14, C16, C18, C20, C26, C28, C30, and C60, etc.) heteroaryl or heteroarylene group;

In Formula (I), the $D_1$, $D_2$, $D_3$ and $D_4$ are each independently selected from any one of a substituted or unsubstituted C6-C40 (e.g., C10, C12, C14, C16, C18, C20, C26, C28, C30, and C60, etc.) aryl group, a substituted or unsubstituted C4-C40 (e.g., C6, C10, C12, C14, C16, C18, C20, C26, C28, C30, and C60, etc.) heteroaryl group, a substituted or unsubstituted C6-C40 (e.g., C10, C12, C14, C16, C18, C20, C26, C28, C30, and C60, etc.) arylamine group, and $D_1$, $D_2$, $D_3$ and $D_4$ are all electron-donating groups;

The electron donating group is a group which increases the electron cloud density on a benzene ring when it replaces the hydrogen on the benzene ring;

the $n_1$, $n_2$, $n_3$ and $n_4$ are each independently 0 or 1, and at least one of the $n_1$, $n_2$, $n_3$ and $n_4$ is 1;

The $m_1$, $m_2$, $m_3$ and $m_4$ are each independently 0 or 1;

When a substituent presents in the above groups, the substituent includes any one or a combination of at least two of cyano, halogen, phenoxy, C1-C20 (e.g., C2, C3, C4, C5, C6, C7, C8, C9, C10, C15, C18, etc.) alkyl group, C1-C20 (e.g., C2, C3, C4, C5, C6, C7, C8, C9, C10, C15, C18, etc.) alkoxyl group, C6-C40 (e.g., C10, C12, C14, C16, C18, C20, C26, C28, C30, C60, etc.) aryl group, C4-C40 (e.g., C6, C10, C12, C14, C16, C18, C20, C26, C28, C30, C60, etc.) heteroaryl group, and C6-C40 (e.g., C10, C12, C14, C16, C18, C20, C26, C28, C30, C60, etc.) arylamine group. The "substituted or unsubstituted" group may be substituted with one substituent or multiple substituents. When there are multiple substituents, they may be selected from different substituents, and the substituents of $L_1$, $L_2$, $L_3$ and $L_4$ do not include halogen and cyano, and are generally aryl or heteroaryl.

In the present disclosure, drawing a single bond across a benzene ring means that the single bond can be connected to any available position of the benzene ring.

The present disclosure provides a new type of bipolar material, which has a phosphorus-oxygen five-membered ring combined with a five-membered ring as an electron acceptor unit. Since the phosphorus-oxygen group has a strong electron accepting ability and a high triplet energy level, when the phosphorus-oxygen five-membered ring combined with a five-membered ring is used as an acceptor group, together with appropriate donor group, used in the light-emitting layer host or dopant material, it will have good hole and electron transport properties, can balance the ratio of electron/hole in the light-emitting area, thereby widening the light-emitting area, improving the luminous efficiency, reducing the operating voltage of the light-emitting device, and increasing the lifetime of the light-emitting device. At the same time, the higher triplet energy level of the phosphorus-oxide group is conducive to the realization of light with a shorter wavelength. The structure of the phosphorus-oxygen five-membered ring combined with a five-membered ring contains two phosphorus oxygen groups, which can further improve the triplet energy level of the designed material, and is easy to achieve the emission of dark blue light;

In addition, the compound of Formula (I) is an organic compound, and has a lower cost than a phosphorescent metal complex.

In one embodiment, at most two of the $n_1$, $n_2$, $n_3$ and $n_4$ are 1.

The preferred compounds of the present disclosure contain at most two electron-donating groups, so as to balance the number of electrons and holes in the light-emitting layer, which can widen the light-emitting region and further improve the luminous efficiency of the device and the lifetime of the device. Too many electron-donating groups will result in the greater transmission rate and number of holes in the light-emitting layer than electrons, thus the accumulation of holes. The accumulation of excessive positive charges will damage the stability of the material and meanwhile reduce the number of formed excitons, thus it will adversely affect the lifetime and luminous efficiency of device.

In one embodiment, the compound has any one of the structures shown by the following Formula (I-1) to Formula (I-8):

(I-1)

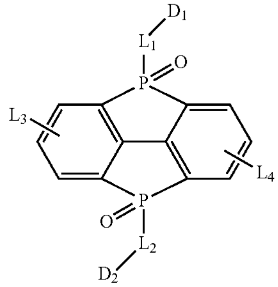

-continued (I-2)

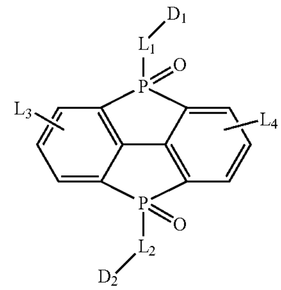

(I-3)

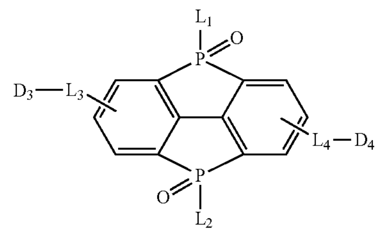

(I-4)

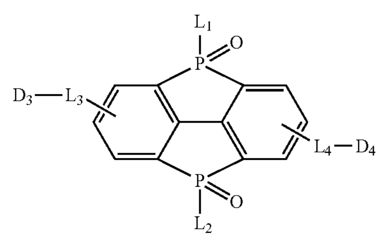

Formula (I-5)

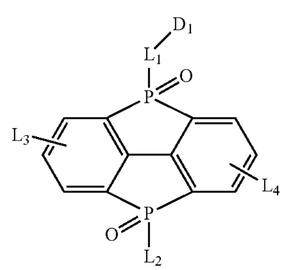

Formula (I-6)

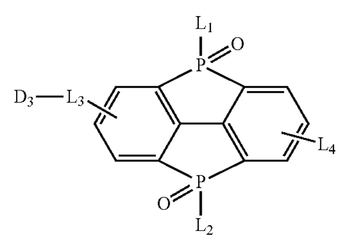

Formula (I-7)

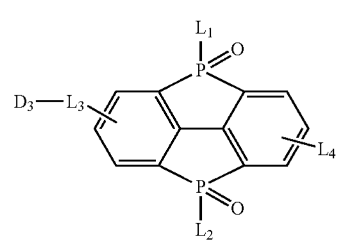

-continued

Formula (I-8)

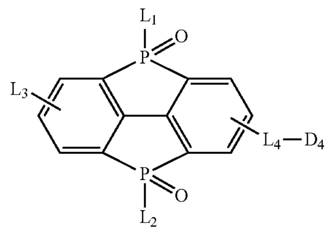

the $L_1$ and $L_2$ are each independently selected from any one of a single bond, a substituted or unsubstituted C6-C40 aryl or arylene group, a substituted or unsubstituted C3-C40 heteroaryl or heteroarylene group;

the $L_3$ and $L_4$ are each independently selected from any one of a single bond, a hydrogen atom, a substituted or unsubstituted C6-C40 aryl or arylene group, a substituted or unsubstituted C3-C40 heteroaryl or heteroarylene group;

the $D_1$, $D_2$, $D_3$ and $D_4$ are each independently selected from any one of a substituted or unsubstituted C6-C40 aryl group, a substituted or unsubstituted C4-C40 heteroaryl group, and a substituted or unsubstituted C6-C40 arylamine group, and the $D_1$, $D_2$, $D_3$ and $D_4$ are all electron-donating groups;

When a substituent presents in the above groups, the substituent includes any one or a combination of at least two of cyano, halogen, phenoxy, C1-C20 alkyl group, C1-C20 alkoxyl group, C6-C40 aryl group, C4-C40 heteroaryl group, and C6-C40 arylamine group.

In the present disclosure, the structures shown in the above I-1 to I-8 are preferable. These structures are more conducive to improving the luminous efficiency. This is because a phosphorus-oxygen group having a strong electron withdrawing ability is combined with a suitable electron donating group, resulting in a material with good electron mobility and hole mobility to balance the concentrations of electrons and holes, so that a wider carrier recombination region can be formed, the exciton formation efficiency can be improved, the luminous efficiency of the device can be improved, and the lifetime of the device can be increased. At the same time, because the structure contains two phosphorus-oxygen groups, it is easy to realize the emission of dark blue light with a shorter wavelength.

In one embodiment, the compound has any one of the structures shown by the following Formula (II-1) to Formula (II-8):

Formula (II-1)

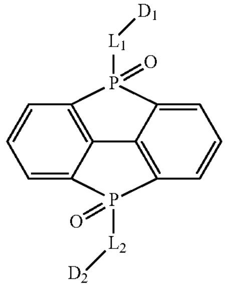

-continued

Formula (II-2)

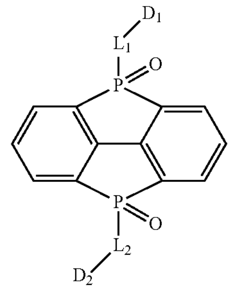

Formula (II-3)

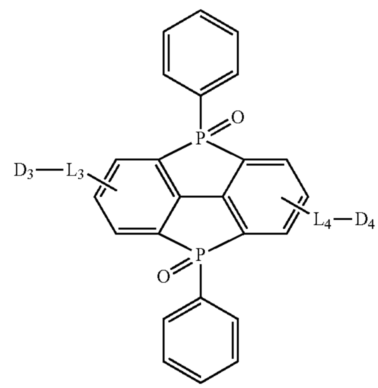

Formula (II-4)

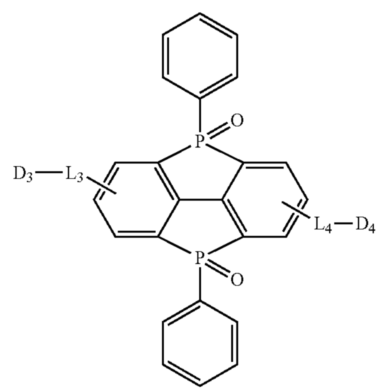

Formula (II-5)

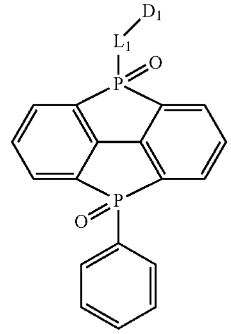

-continued

Formula (II-6)

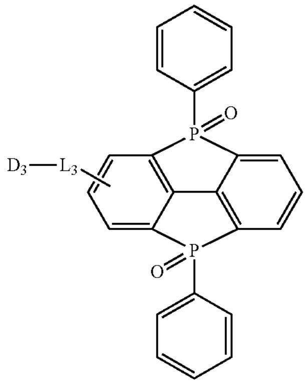

Formula (II-7)

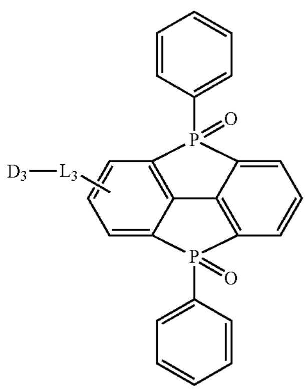

Formula (II-8)

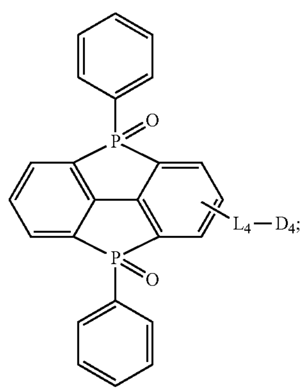

the $D_1$, $D_2$, $D_3$ and $D_4$ are each independently selected from any one of a substituted or unsubstituted C6-C40 aryl group, a substituted or unsubstituted C4-C40 heteroaryl group, and a substituted or unsubstituted C6-C40 arylamine group, and the $D_1$, $D_2$, $D_3$ and $D_4$ are all electron-donating groups;

the $L_1$, $L_2$, $L_3$ and $L_4$ are each independently selected from any one of a single bond, a substituted or unsubstituted C6-C40 arylene group, a substituted or unsubstituted C3-C40 heteroarylene group;

When a substituent presents in the above groups, the substituent includes any one or a combination of at least two of cyano, halogen, phenoxy, C1-C20 alkyl group, C1-C20 alkoxyl group, C6-C40 aryl group, C4-C40 heteroaryl group, and C6-C40 arylamine group.

In the present disclosure, the structures shown in the above II-1 to II-8 are further preferable, which can further improve the luminous efficiency. This is because a phosphorus-oxygen group having a strong electron withdrawing ability is combined with a suitable electron donating group, resulting in a material with good electron mobility and hole mobility to balance the concentrations of electrons and holes, so that a wider carrier recombination region can be formed, the exciton formation efficiency can be improved, and the luminous efficiency of the device can be improved, and the lifetime of the device can be increased. At the same time, because the structure contains two phosphorus-oxygen groups, it is easy to realize the emission of dark blue light with a shorter wavelength.

In one embodiment, the $D_1$, $D_2$, $D_3$ and $D_4$ are each independently selected from any one of a substituted or unsubstituted C4-C40 carbazole group, a substituted or unsubstituted C4-C40 acridine group, a substituted or unsubstituted C6-C40 arylamine group, a substituted or unsubstituted fluorenyl group, a substituted or unsubstituted spirofluorenyl group, a substituted or unsubstituted diphenyl ether group, and a substituted or unsubstituted diindolocyclopentadiene group;

When a substituent presents in the above groups, the substituent includes any one or a combination of at least two of cyano, halogen, phenoxy, C1-C20 alkyl group, C1-C20 alkoxyl group, C6-C40 aryl group, C4-C40 heteroaryl group, and C6-C40 arylamine group.

The combination of the above specific electron-donating groups and the mother nucleus can enable the compound to have a good transmission rate for both electrons and holes, balance the concentrations of holes and electrons in the light-emitting region, thereby improving the efficiency of formation of excitons and widening the light-emitting region, and further improving the luminous efficiency of the device. The balance of electrons and holes avoid the disadvantages of the damage of material caused by too high concentration of single carrier in the light-emitting layer, thereby improving the efficiency of device. At the same time, the higher triplet energy level of the phosphorus-oxygen group also facilitates the emission of dark blue light.

In the present disclosure, the carbazole group refers to a type of group containing a carbazole structure or a heteroatom-substituted carbazole structure. For example,

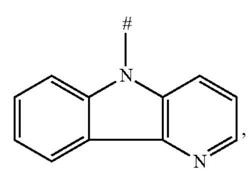

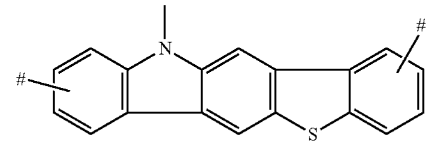

and

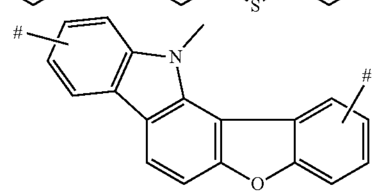

all belong to the carbazole group. The principle applies to the acridine group.

In one embodiment, the substituted or unsubstituted C4-C40 carbazole group specifically includes the following groups which are substituted or unsubstituted:

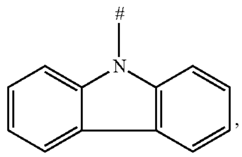

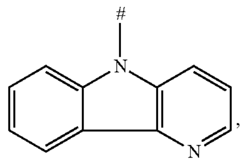

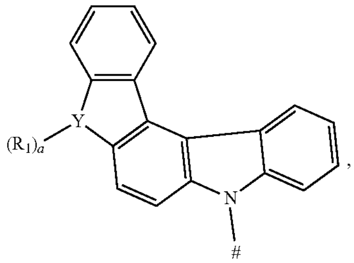

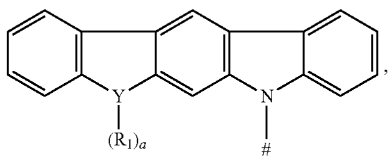

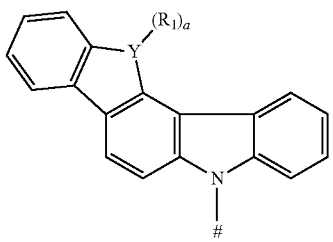

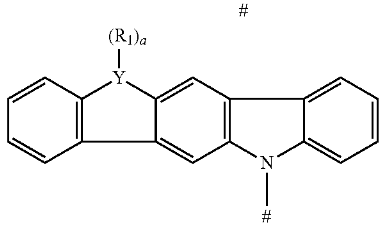

the Y is independently selected from any one of a carbon atom, a nitrogen atom, an oxygen atom, a sulfur atom, and a silicon atom;

the a is selected from an integer of 0-2;

the $R_1$ is selected from any one of a hydrogen atom, a substituted or unsubstituted C1-C20 alkyl group, a substituted or unsubstituted C1-C20 alkoxyl group, a substituted or unsubstituted C6-C30 aryl group, and a substituted or unsubstituted C3-C30 heteroaryl group;

When a substituent presents in the above groups, the substituent includes any one or a combination of at least two of cyano, halogen, phenoxy, C1-C20 alkyl group, C1-C20 alkoxyl group, C6-C40 aryl group, C4-C40 heteroaryl group, and C6-C40 arylamine group;

wherein # represents the linking site of the group.

In the present disclosure, the carbazole groups of the above five specific structures are preferred. The series of carbazole groups of the specific structure has the following advantages: (1) the raw materials are cheap and the cost is low; (2) it is easy to modify the molecular properties without changing the main skeleton structure of the molecule; (3) the nitrogen atom is easy to be functionally modified; (4) there are multiple linking sites on the carbazole group, which can be connected with other molecular structures; (5) the obtained compound has good thermal stability and chemical stability; (6) the obtained compound has a high triplet energy level; (7) the obtained compound has excellent electron-donating ability and light-emitting performance, and has excellent hole-transporting characteristics. Therefore, the combination of the carbazole-based electron-donating group with excellent performance and the phosphorus-oxygen group having a strong electron-withdrawing ability in the mother nucleus is beneficial to the formation of a bipolar host material with good electron and hole transport rates. By further design of the molecular structure, TADF materials with excellent properties can also be realized.

In one embodiment, the substituted or unsubstituted C4-C40 acridine group specifically includes the following groups which are substituted or unsubstituted:

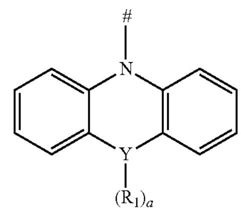

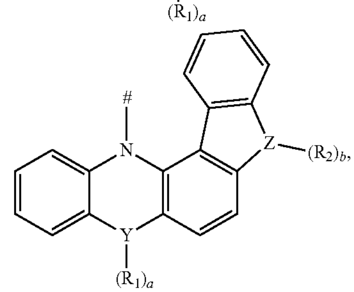

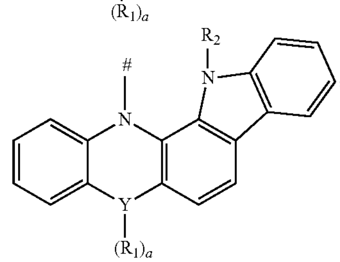

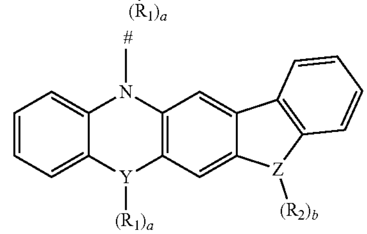

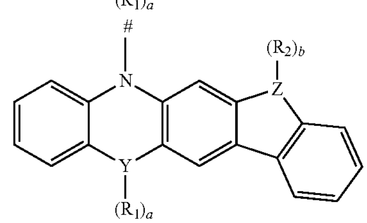

wherein Y and Z are each independently selected from any one of a carbon atom, a nitrogen atom, an oxygen atom, a sulfur atom, and a silicon atom;

the a and b are each independently selected from an integer of 0-2;

the $R_1$ and $R_2$ are each independently selected from any one of a hydrogen atom, a substituted or unsubstituted C1-C20 alkyl group, a substituted or unsubstituted C1-C20 alkoxyl group, a substituted or unsubstituted C6-C30 aryl group, and a substituted or unsubstituted C3-C30 heteroaryl group;

When a substituent presents in the above groups, the substituent includes any one or a combination of at least two of cyano, halogen, phenoxy, C1-C20 alkyl group, C1-C20 alkoxyl group, C6-C40 aryl group, C4-C40 heteroaryl group, and C6-C40 arylamine group;

wherein # represents the linking site of the group.

According to the present disclosure, the acridine groups having the above specific preferable structure have the following advantages: (1) very strong electron-donating ability and shorter delayed fluorescence lifetime; (2) being favorable for better separation of HOMO and LUMO; (3) rigid molecular structure that can effectively reduce the non-radiative attenuation of the excited state; (4) rigid molecular structure that reduces the free rotational vibration in the molecule, which is conducive to improving the monochromaticity of the material and reducing the FWHM (half-height width of the luminous peak) of the material; and (5) high triplet energy level. This series of acridine-based groups can further improve the luminous efficiency of the device.

In one embodiment, the substituted or unsubstituted C6-C40 arylamine group specifically includes the following group which is substituted or unsubstituted:

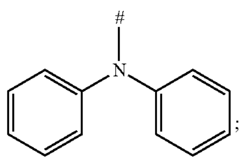

When a substituent presents in the above group, the substituent includes any one or a combination of at least two of cyano, halogen, phenoxy, C1-C20 alkyl group, C1-C20 alkoxyl group, C6-C40 aryl group, C4-C40 heteroaryl group, and C6-C40 arylamine group;

wherein # represents the linking site of the group.

In the present disclosure, the arylamine group of the above structure is preferred. The arylamine group of this structure has a strong electron-donating ability, and at the same time, the three aryl groups connected to the N atom in the arylamine structure have a large torsion angle. In this way, a large steric hindrance can be formed, which prevents the shortcomings of luminescent quenching and rising of sublimation temperature caused by close intermolecular packing, thereby further improving the luminous efficiency of the device.

In one embodiment, the $D_1$, $D_2$, $D_3$ and $D_4$ are each independently selected from any one of the following groups which are substituted or unsubstituted:

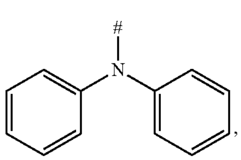

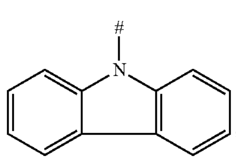

-continued

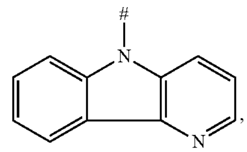

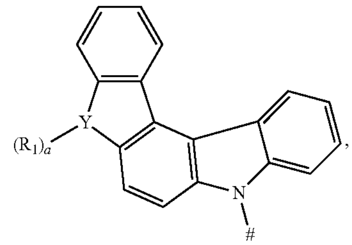

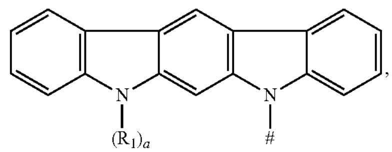

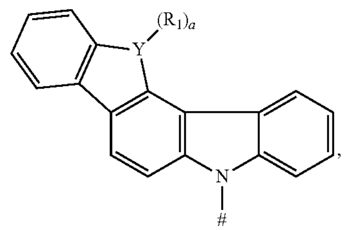

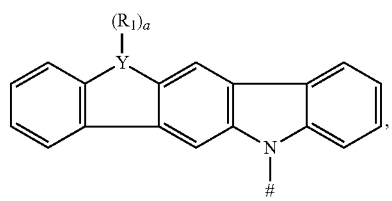

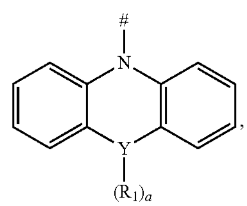

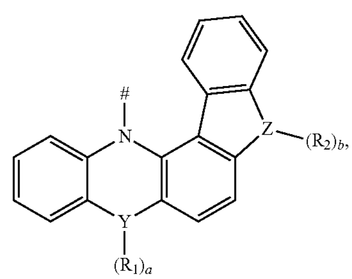

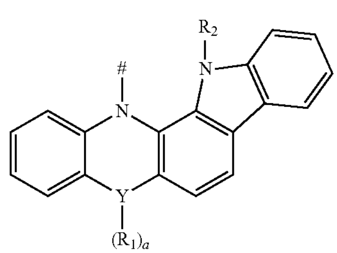

-continued

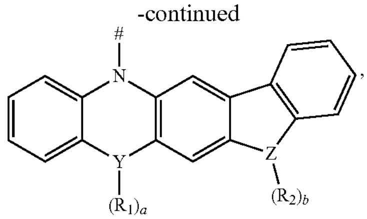

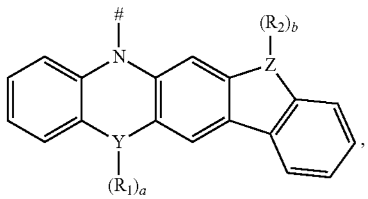

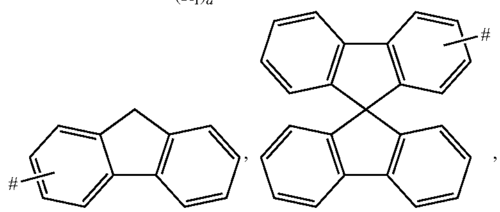

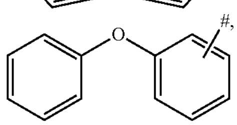

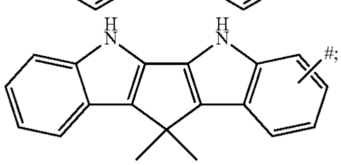

wherein Y and Z are each independently selected from any one of a carbon atom, a nitrogen atom, an oxygen atom, a sulfur atom, and a silicon atom;

the a and b are each independently selected from an integer of 0-2;

the $R_1$ and $R_2$ are each independently selected from any one of a hydrogen atom, a substituted or unsubstituted C1-C20 alkyl group, a substituted or unsubstituted C1-C20 alkoxyl group, a substituted or unsubstituted C6-C30 aryl group, and a substituted or unsubstituted C3-C30 heteroaryl group;

When a substituent presents in the above groups, the substituent includes any one or a combination of at least two of cyano, halogen, phenoxy, C1-C20 alkyl group, C1-C20 alkoxyl group, C6-C40 aryl group, C4-C40 heteroaryl group, and C6-C40 arylamine group;

wherein # represents the linking site of the groups.

In the present disclosure, the above-mentioned groups with specific structures are preferred. The series of groups with specific structures have strong electron-donating ability and high triplet energy level. They can be combined with the phosphorus-oxygen five-membered ring combined with a five-membered ring having electron-withdrawing properties, so as to balance the mobility of electrons and holes, promote the recombination of electrons and holes to form excitons, widen the light emitting area, and further improve the luminous efficiency of the device.

In one embodiment, the $D_1$, $D_2$, $D_3$ and $D_4$ are each independently selected from any one of the following groups:

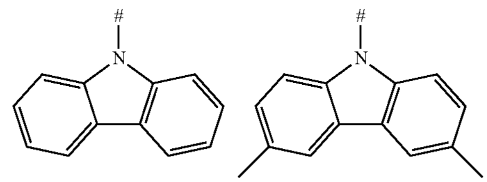

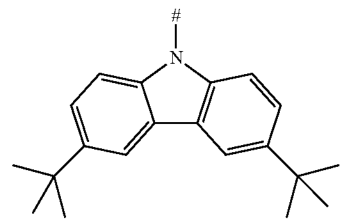

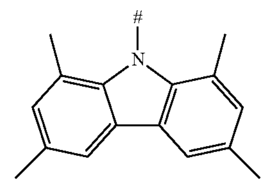

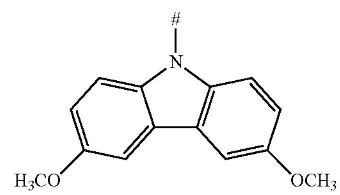

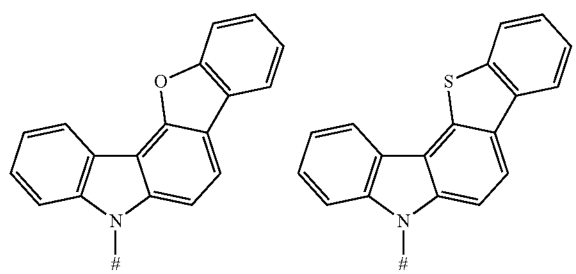

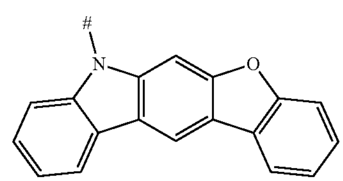

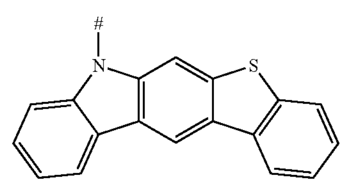

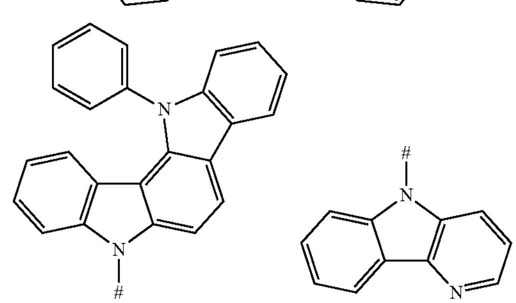

-continued
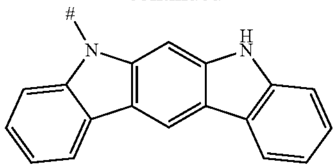
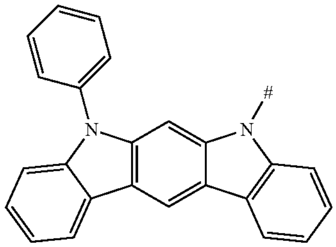
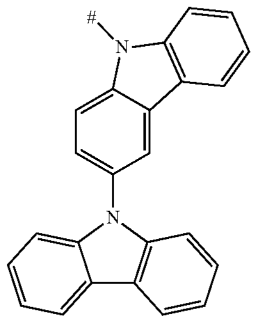
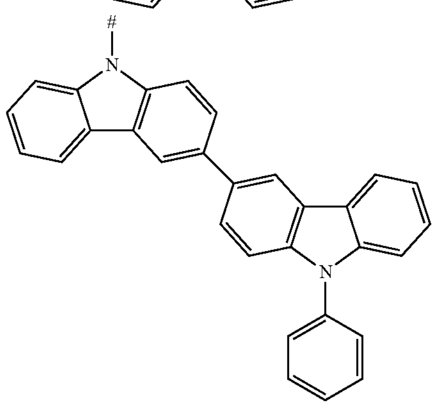
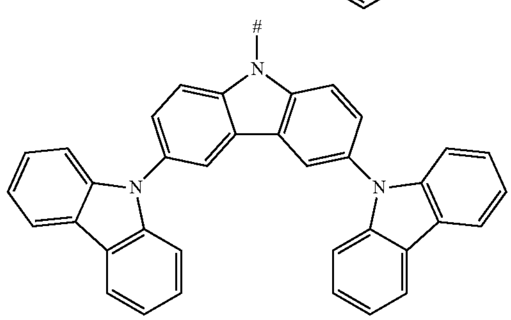
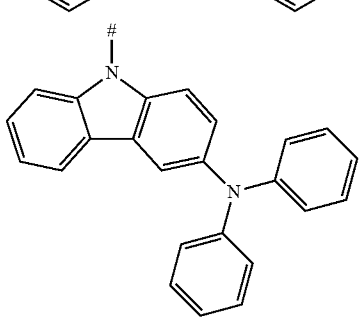
-continued
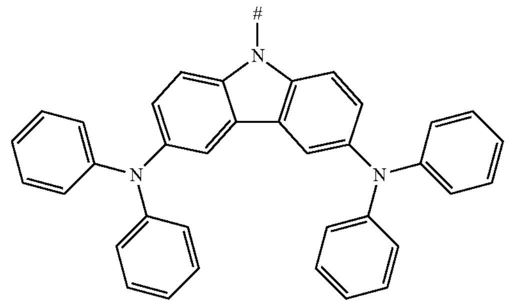
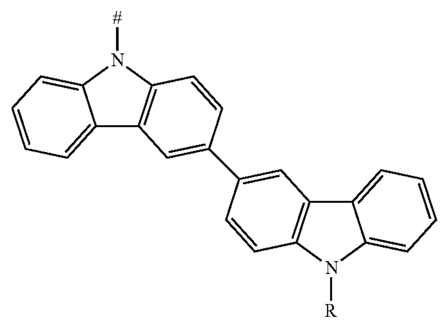
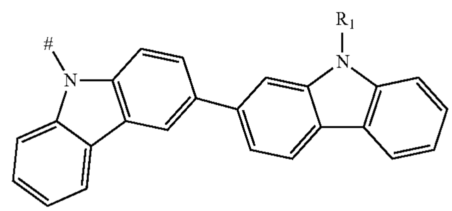
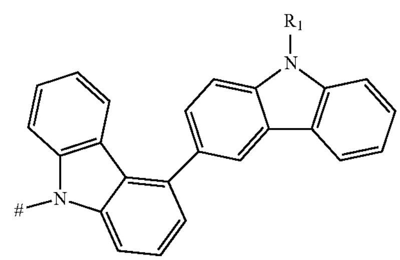
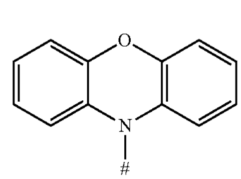
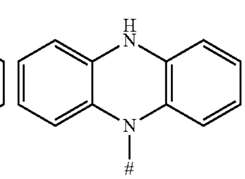
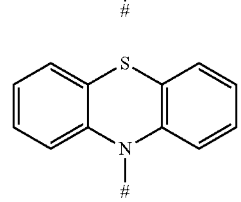
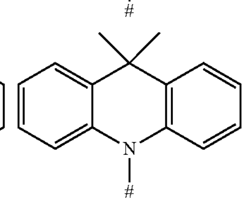
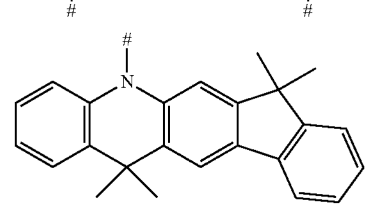

-continued

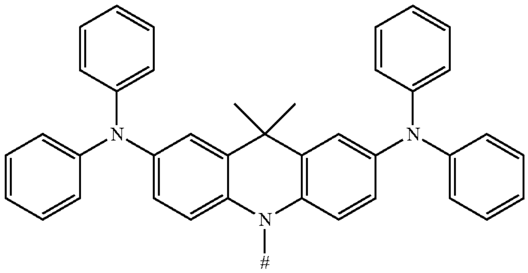

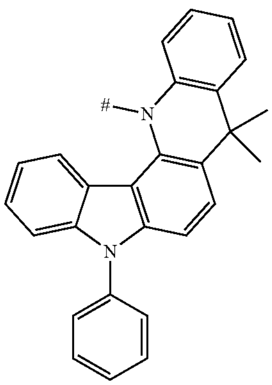

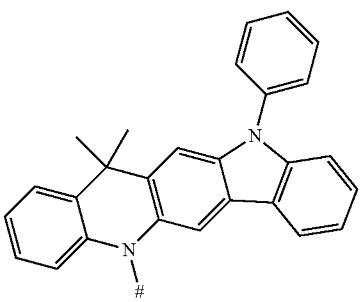

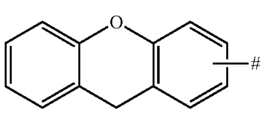

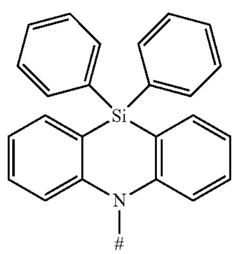

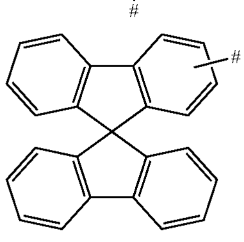

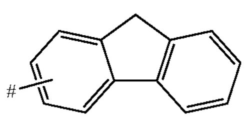

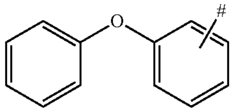

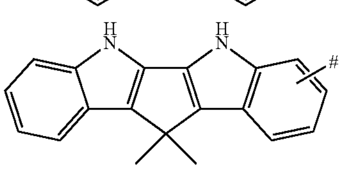

-continued

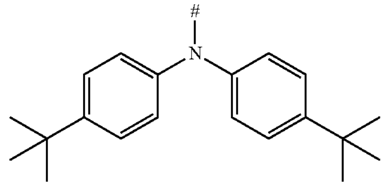

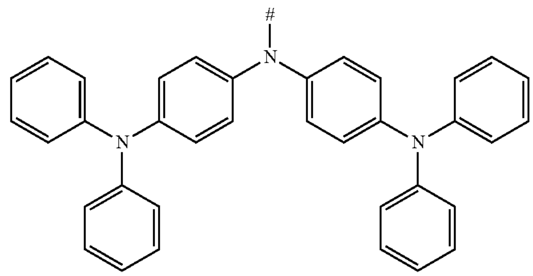

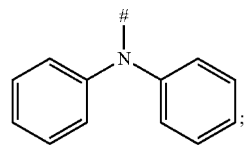

;

the $R_1$ is selected from any one of a hydrogen atom, a substituted or unsubstituted C1-C20 alkyl group, a substituted or unsubstituted C1-C20 alkoxyl group, a substituted or unsubstituted C6-C30 aryl group, and a substituted or unsubstituted C3-C30 heteroaryl group;

When a substituent presents in the above groups, the substituent includes any one or a combination of at least two of cyano, halogen, phenoxy, C1-C20 alkyl group, C1-C20 alkoxyl group, C6-C40 aryl group, C4-C40 heteroaryl group, and C6-C40 arylamine group;

wherein # represents the linking site of the groups.

In the present disclosure, the above-mentioned electron-donating groups with a specific structure are further preferred, and these groups have the following advantages: (1) good thermal stability and electrochemical stability; (2) good electron-donating ability; (3) more modification sites; (4) a higher triplet energy level, which can further improve the luminous efficiency of the device.

In one embodiment, the $L_1$, $L_2$, $L_3$ and $L_4$ are each independently selected from any one of a single bond, a phenylene group, a thienylene group, a naphthylene group, an anthrylene group, a phenanthrylene group, or a pyrenylene group.

In one embodiment, the $L_1$, $L_2$, $L_3$ and $L_4$ are each independently selected from a single bond or a phenylene group.

In one embodiment, the compound has any one of the following structures:

P1
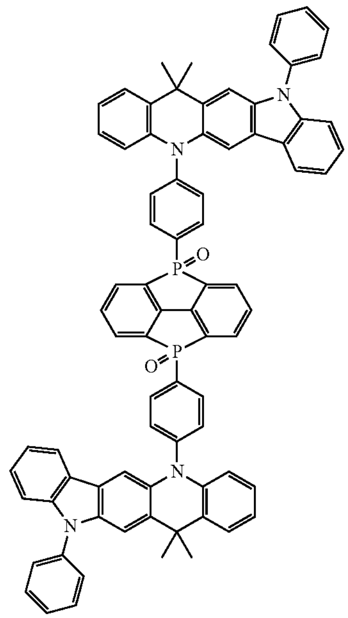
P2
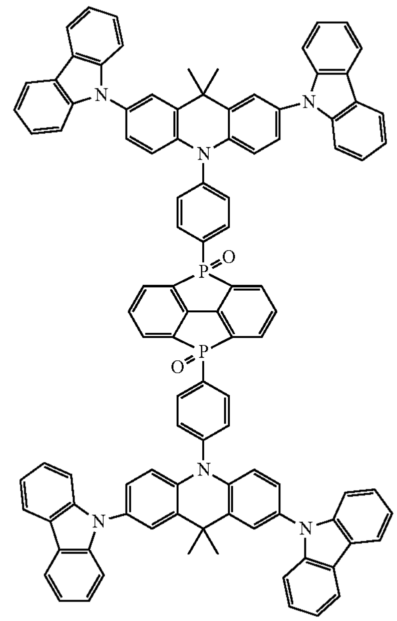
P3
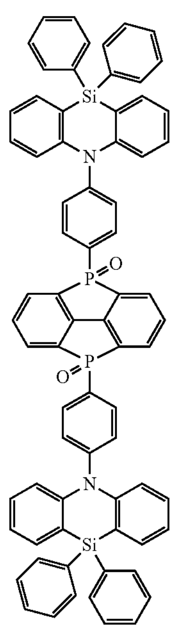
P4
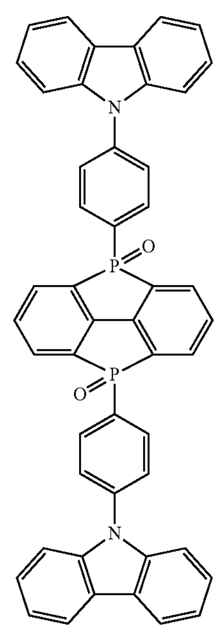

-continued
P5
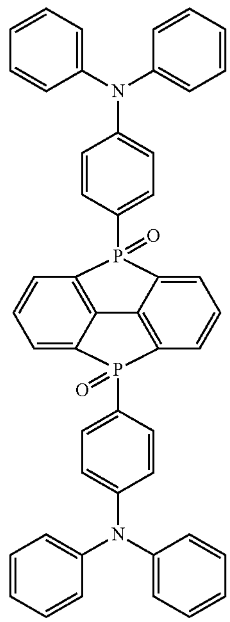
P6
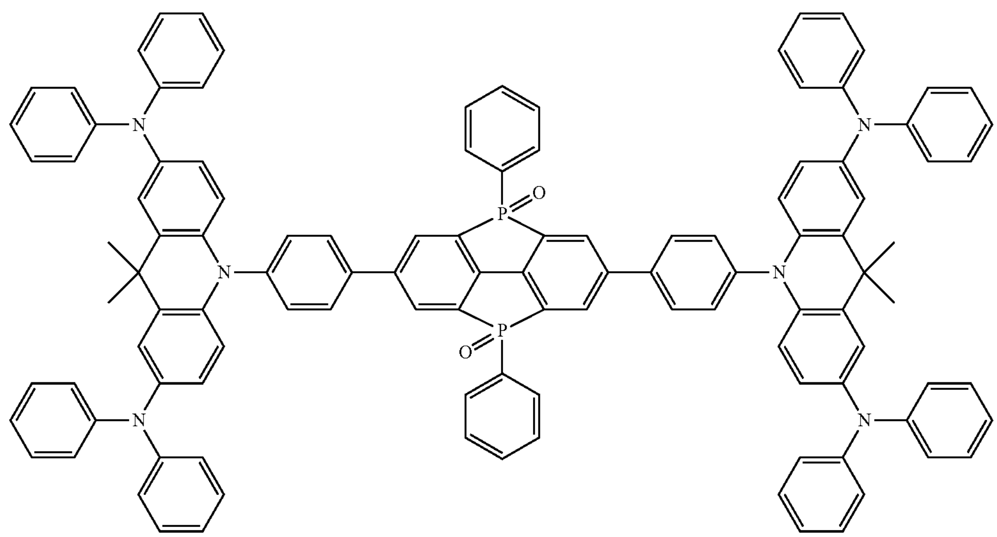
P7
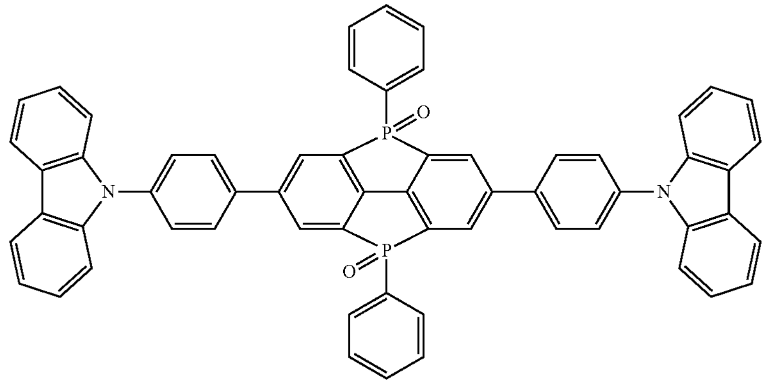

-continued
P8
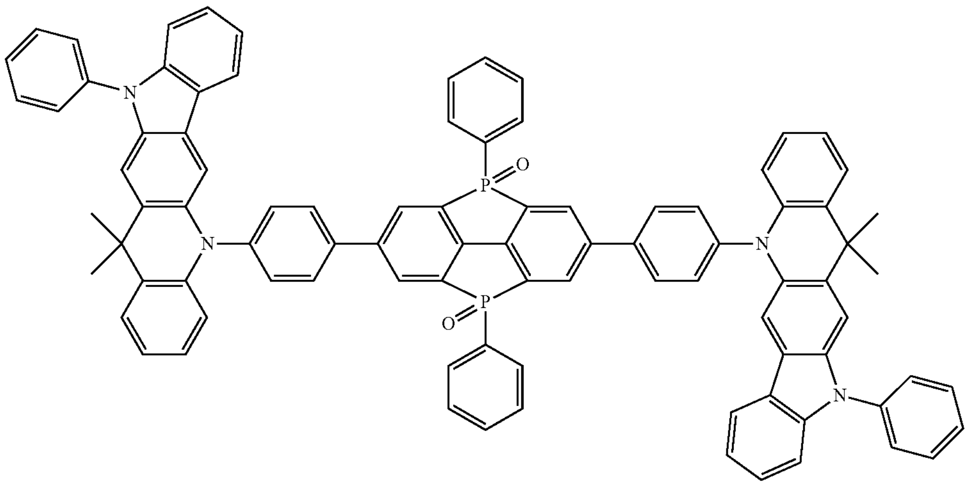
P9
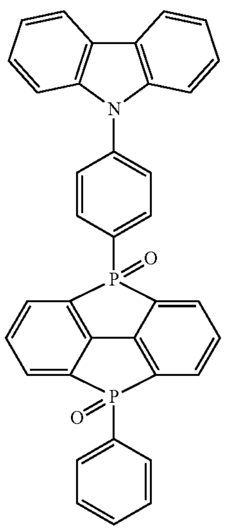
P10
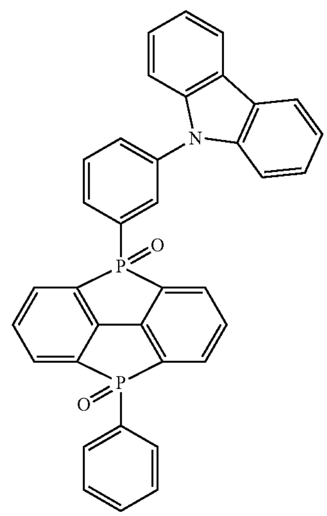
P11
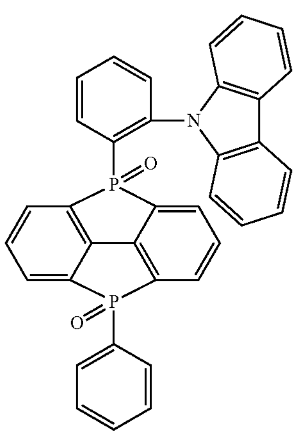
P12
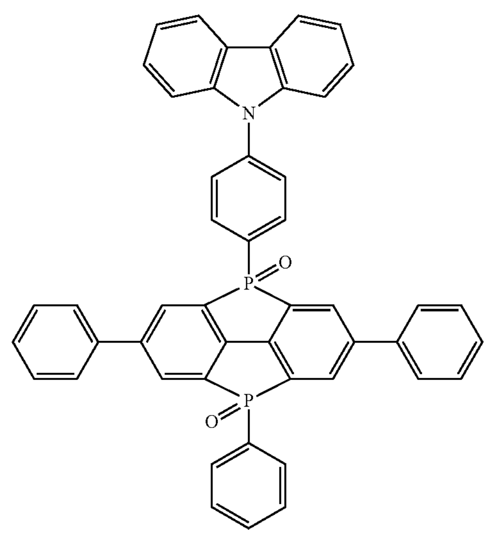

-continued
P13
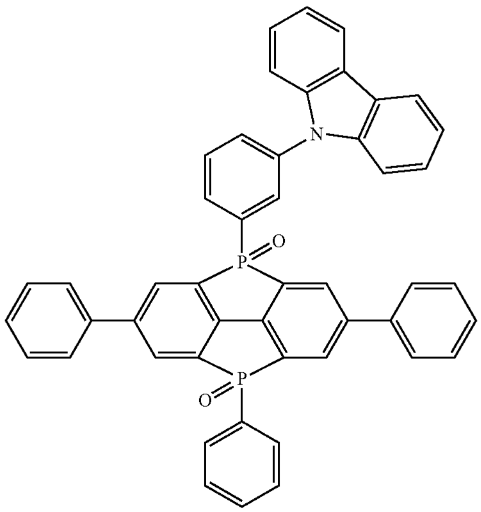
P14
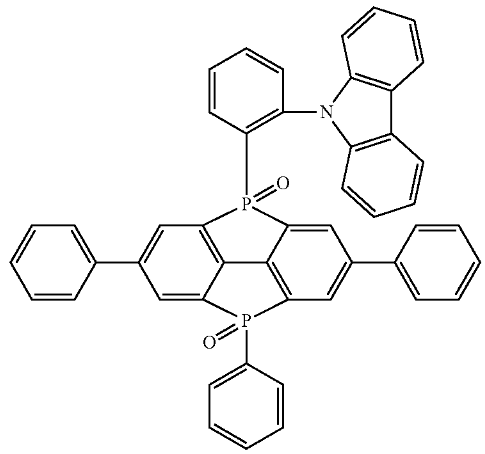
P15
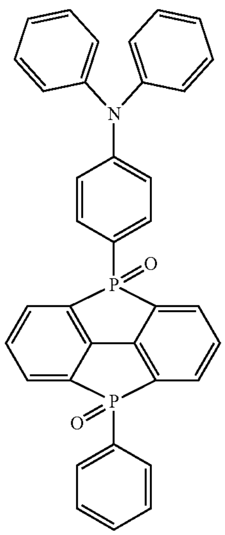
P16
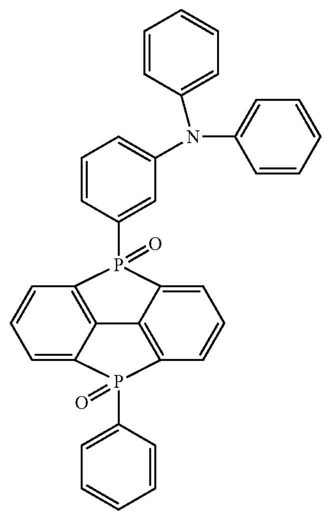
P17
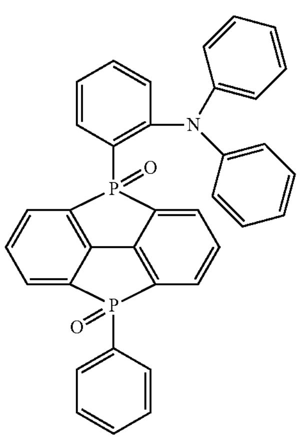
P18
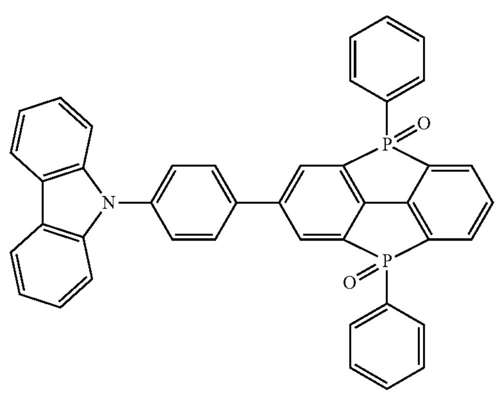

-continued
P19
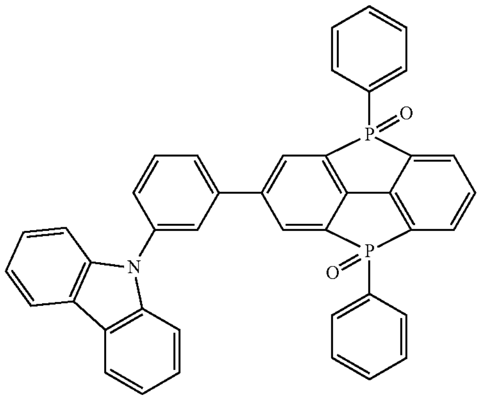
P20
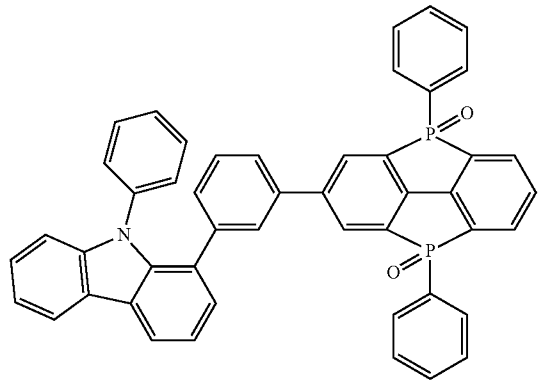
P21
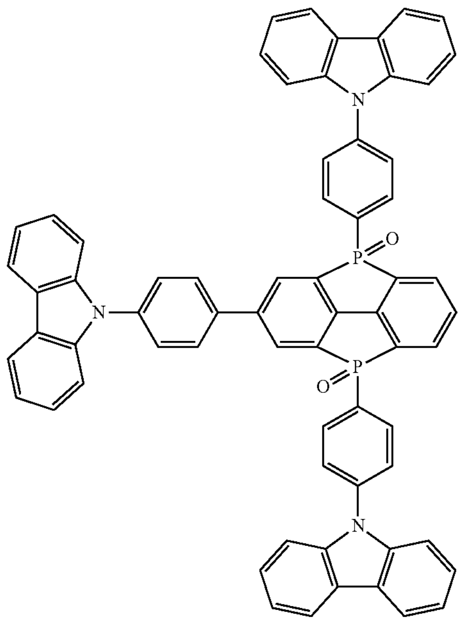
P22
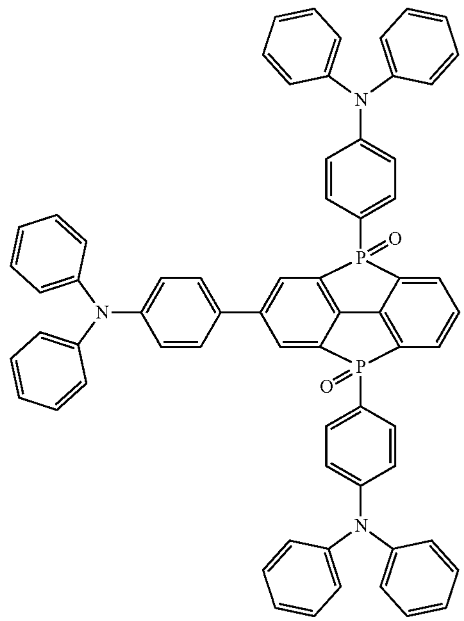
P23
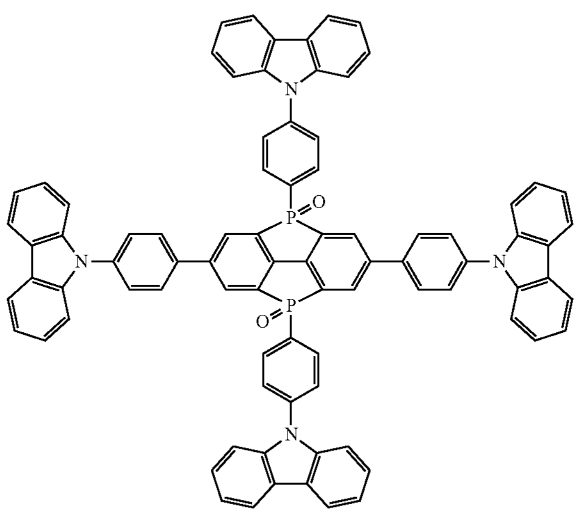
P24
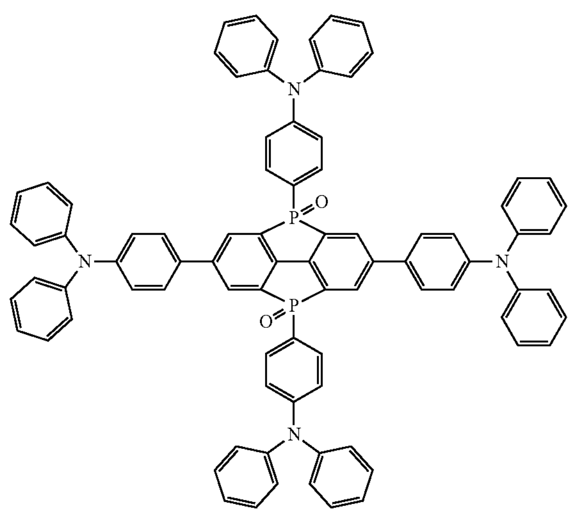

-continued
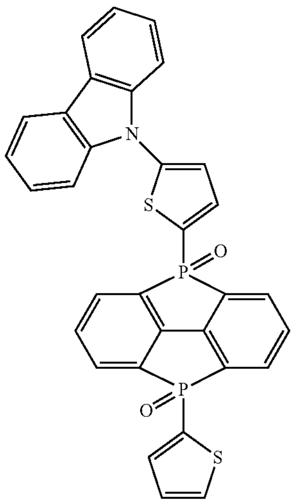
P25
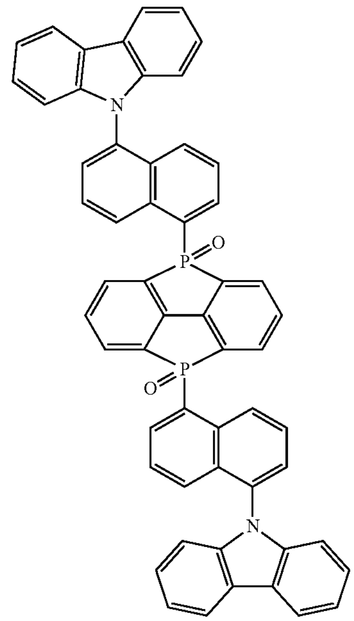
P26
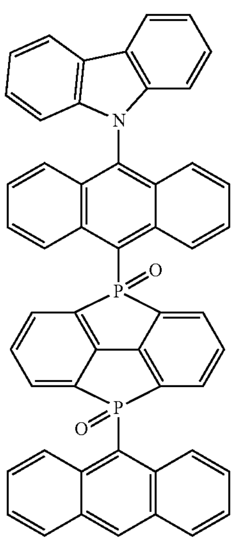
P27
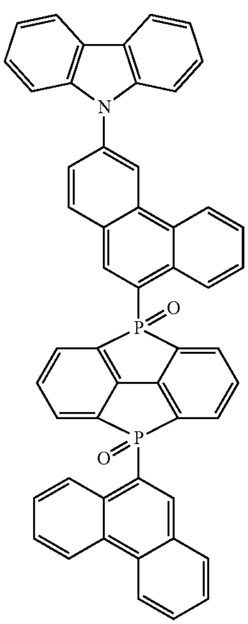
P28

-continued
P29
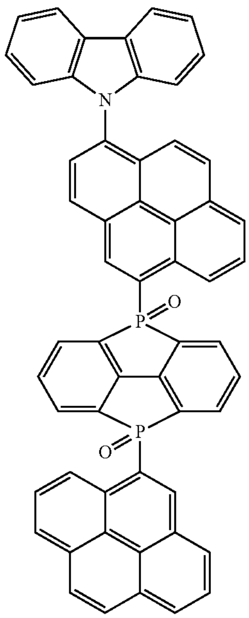
P30
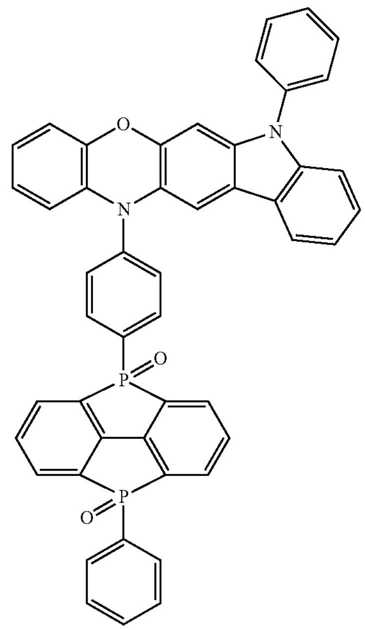
P31
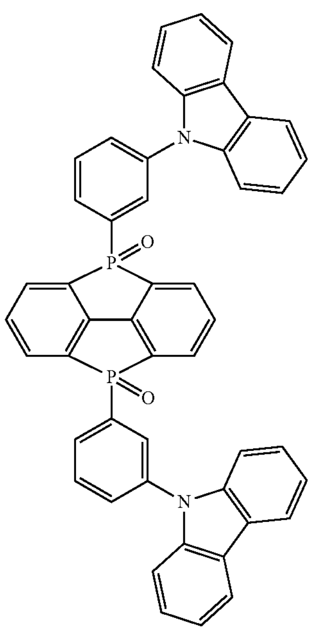
P32
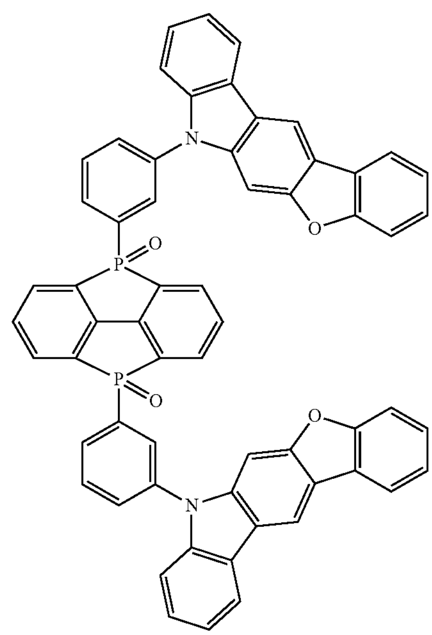

-continued
P33
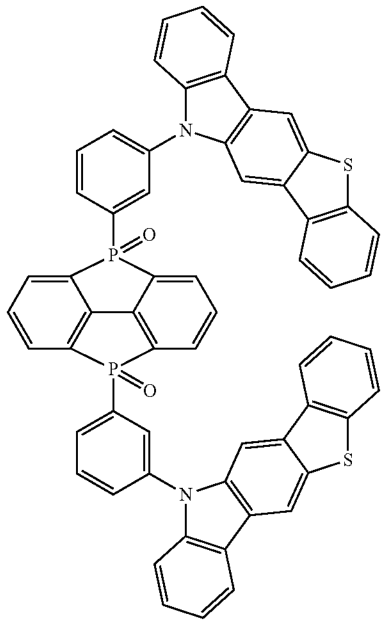
P34
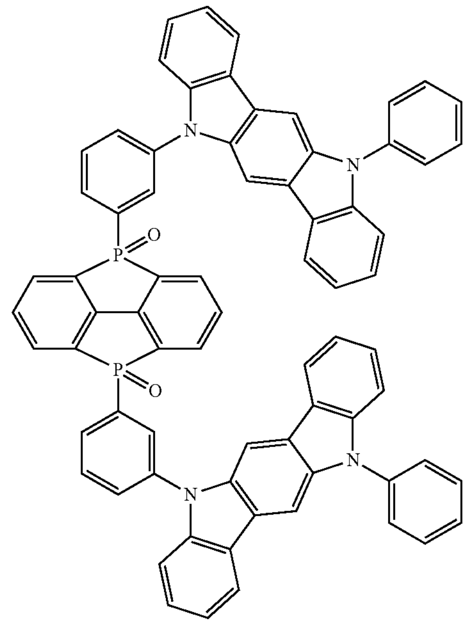
P35
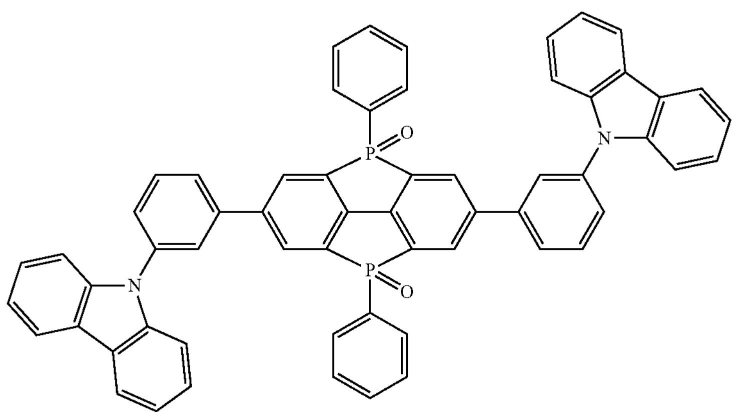
P36
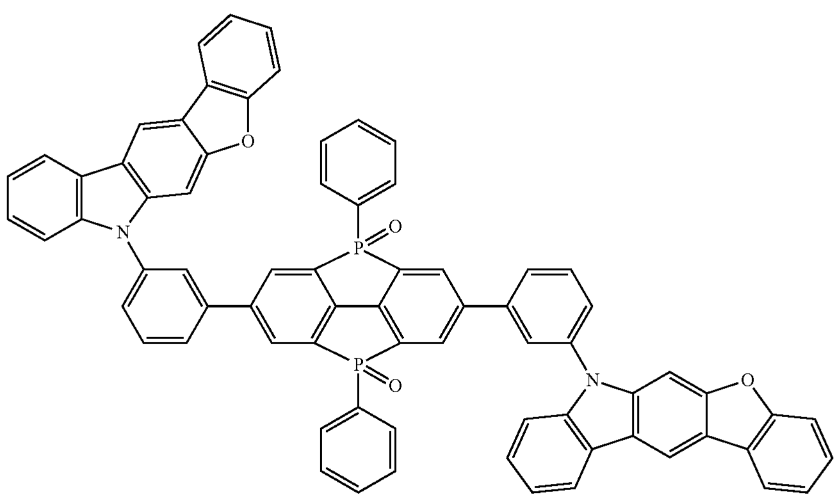

-continued
P37
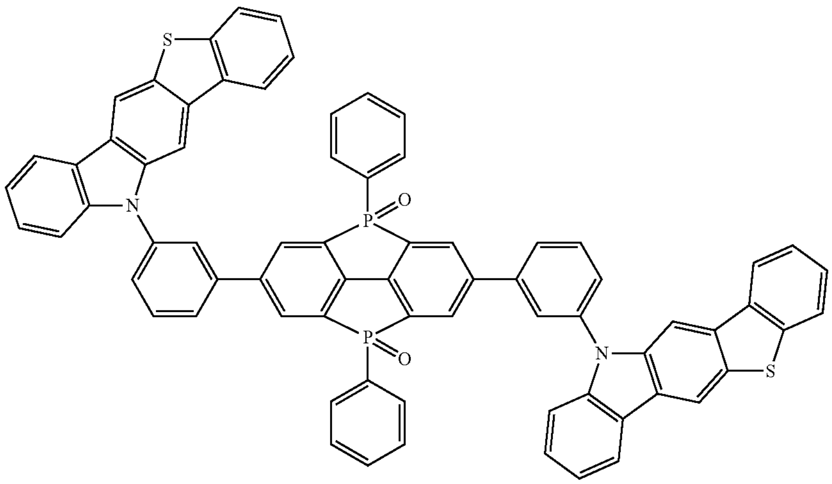
P38
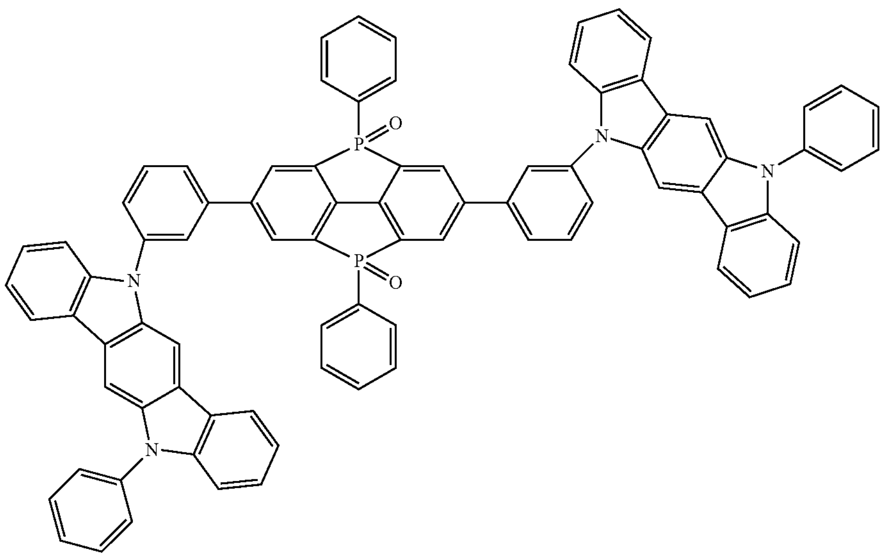
P39
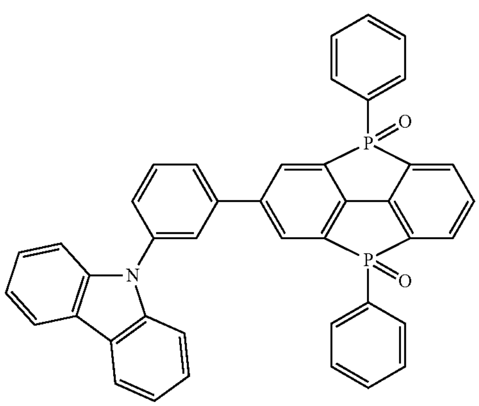
P40
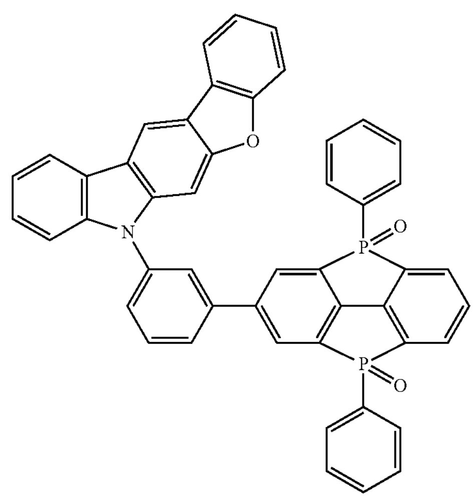

-continued
P41
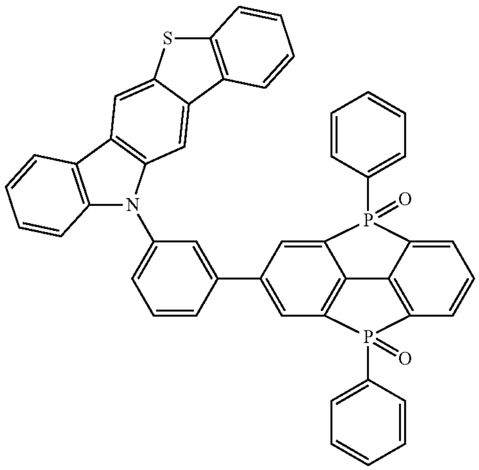
P42
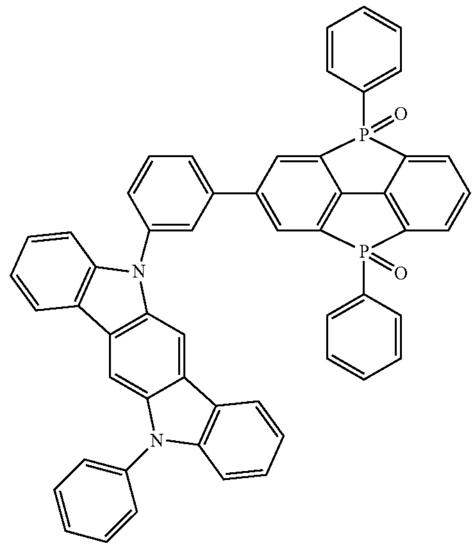
P43
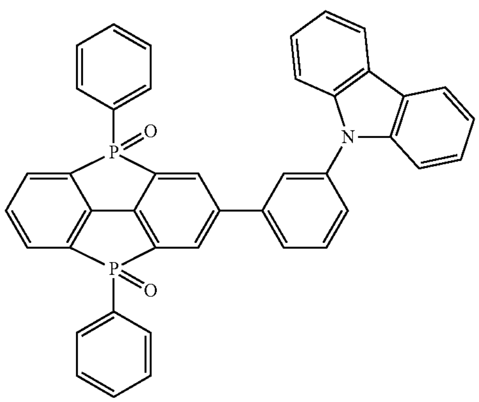
P44
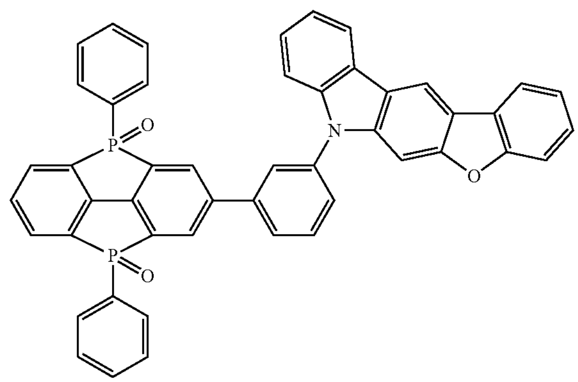
P45
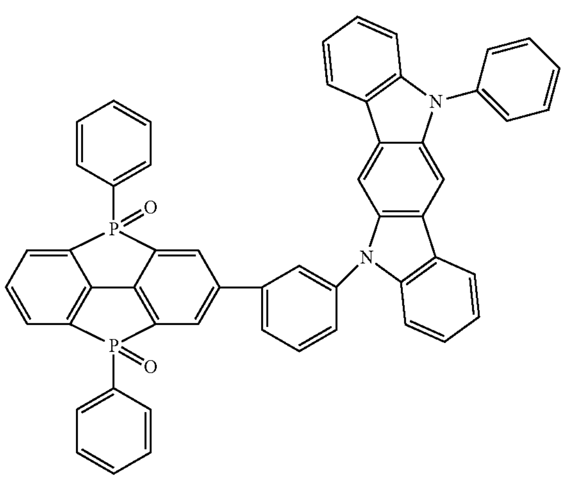
P46
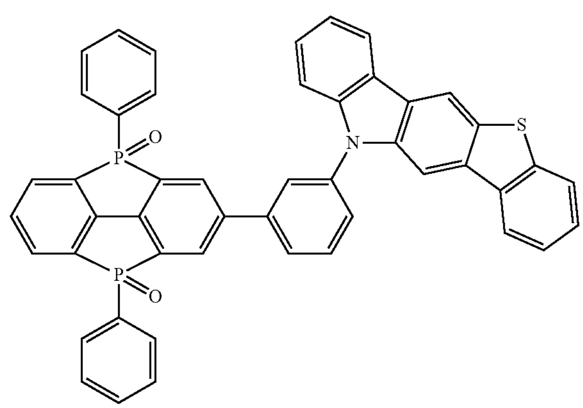

-continued
P47
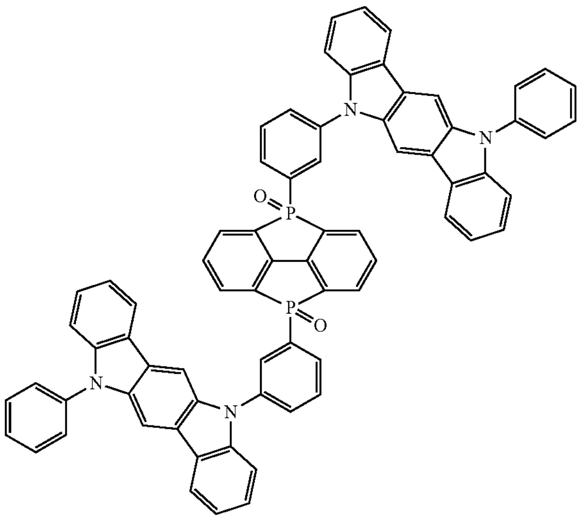
P48
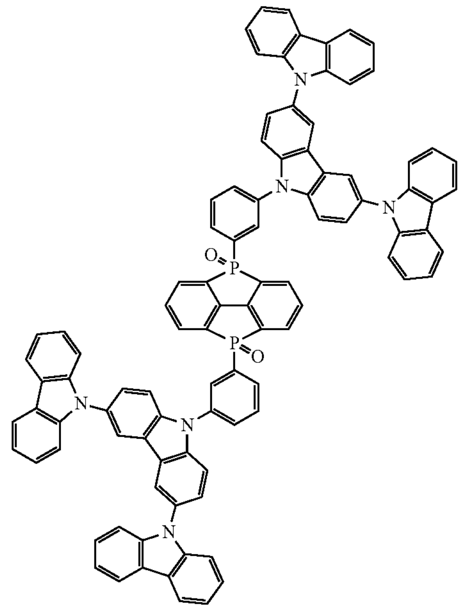
P49
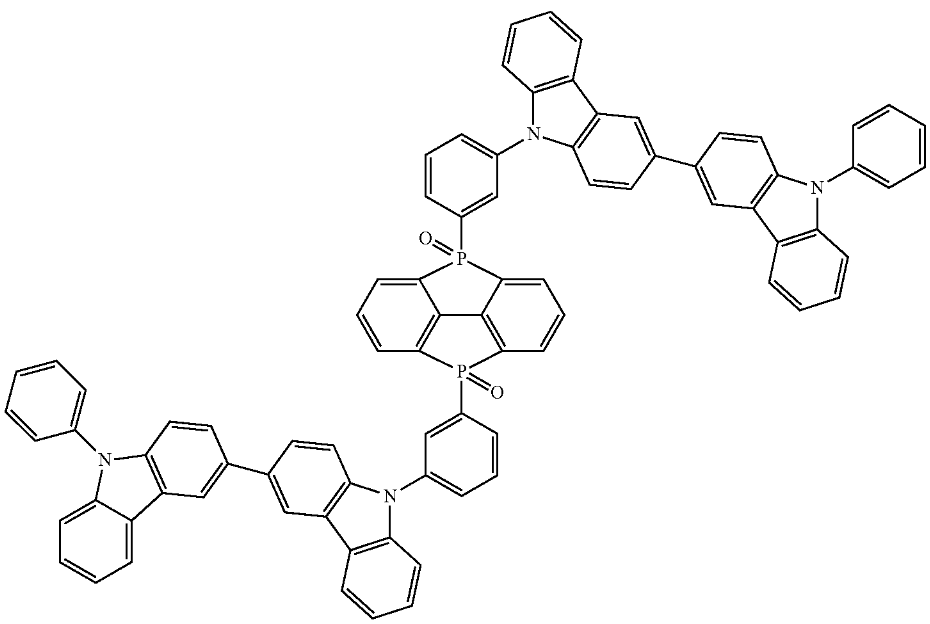
P50
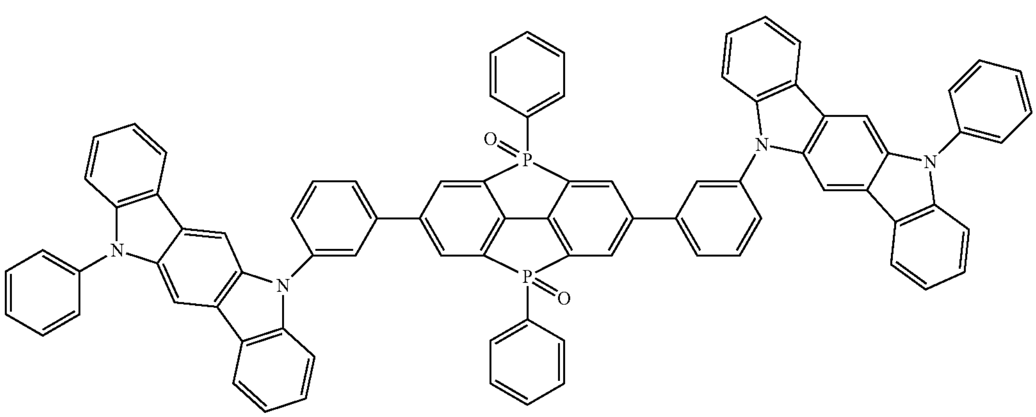

-continued
P51
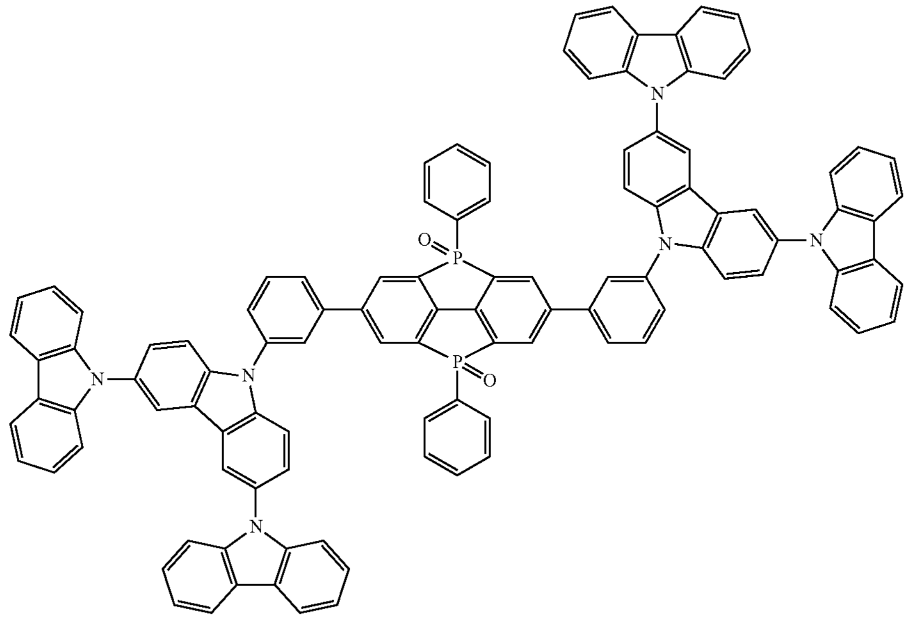
P52
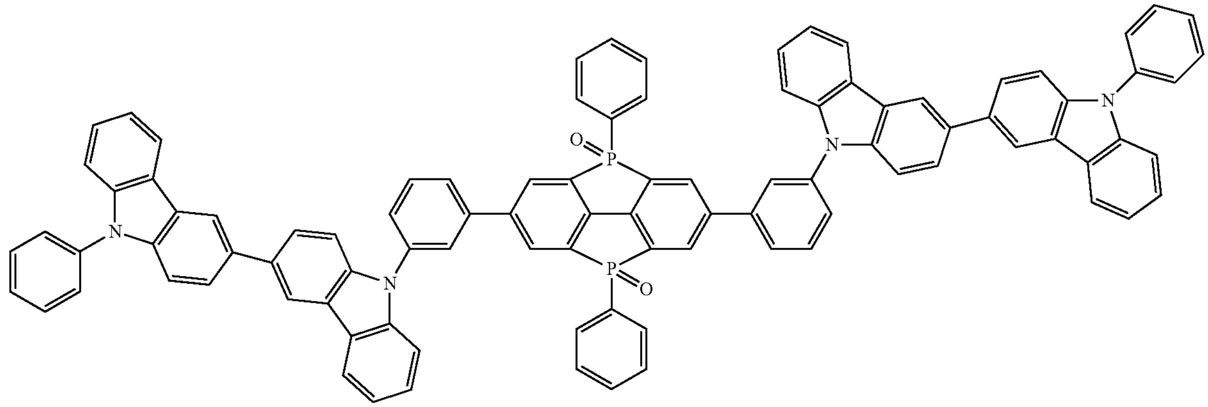
P53
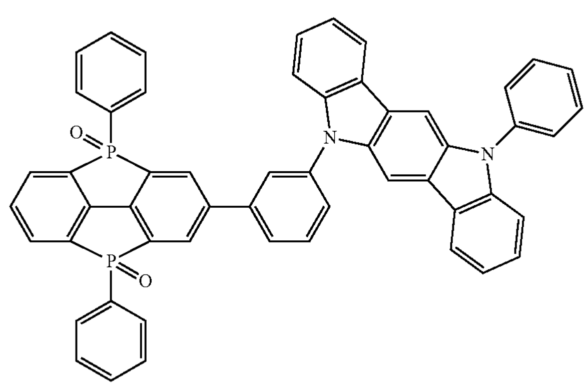
P54
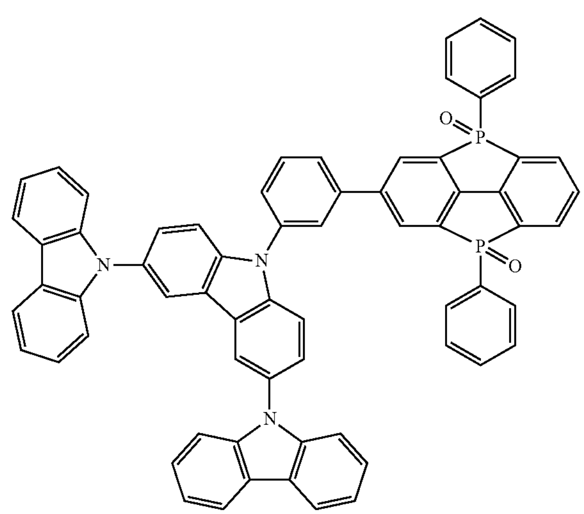

-continued

P55

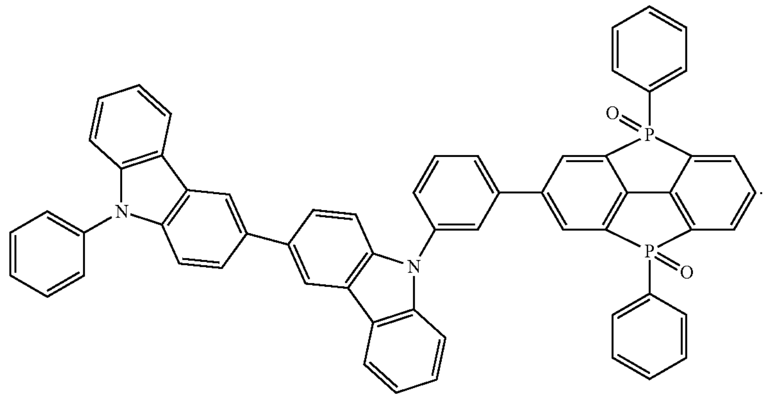

In one embodiment, the compound has $\Delta E_{st}=E_{S1}-E_{T1}\leq 0.30$ eV.

A second embodiment of the present disclosure is to provide a way to build an organic photoelectric device using the compound.

Another embodiment the present disclosure is to provide a complete organic photoelectric device including the compound. The organic photoelectric device includes an anode, a cathode, and at least one organic thin film located between the anode and the cathode. The organic thin film contains the compound according to the first embodiment.

In one embodiment, the organic thin film includes a light emitting layer, and the light emitting layer contains the compound according to the first embodiment.

In one embodiment, the compound of the first embodiment is used as a host material, a doping material or a co-doping material of a light emitting layer.

In one embodiment, the organic thin film layer further comprises any one or a combination of at least two of a hole transport layer, a hole injection layer, an electron blocking layer, a light-emitting layer, a hole blocking layer, an electron transport layer and an electron injection layer.

In the organic photoelectric device, the anode material may be selected from metals such as copper, gold, silver, iron, chromium, nickel, manganese, palladium, platinum and the like, and alloys thereof. The anode material may also be selected from metal oxides such as indium oxide, zinc oxide, indium tin oxide (ITO), indium zinc oxide (IZO), and the like; and the anode material may also be selected from conductive polymers such as polyaniline, polypyrrole, poly (3-methylthiophene), and the like. In addition, the anode material may also be selected from materials which facilitate hole injection other than the anode materials listed above, and combinations thereof, which includes materials known to be suitable as anodes.

In the organic photoelectric device, the cathode material may be selected from metals such as aluminum, magnesium, silver, indium, tin, titanium, and the like, and alloys thereof. The cathode material can also be selected from multilayer metal materials such as LiF/Al, $LiO_2$/Al, and $BaF_2$/Al, and the like. In addition to the cathode materials listed above, the cathode materials can also be materials that facilitate electron injection and combinations thereof, including materials known to be suitable as cathodes.

In the embodiment of the present disclosure, the organic photoelectric device is manufactured as follows: forming an anode on a transparent or non-transparent smooth substrate, forming an organic thin layer on the anode, and forming a cathode on the organic thin layer. The organic thin layer can be formed by known film-forming methods such as evaporation, sputtering, spin coating, dipping, and ion plating, etc. Finally, an organic optical cover layer CPL (cap layer) is prepared on the cathode. The optical cover layer CPL can be prepared by evaporation or solution processing methods. Solution processing methods include inkjet printing, spin coating, doctor blade coating, screen printing, and roll-to-roll printing, etc.

The method for synthesizing the compound having the structure of the Chemical Formula (I) provided by the present disclosure is as follows: reacting 2,2',6,6'-tetrabromobiphenyl and bis(trimethyltin)phosphobenzene in trifluoromethyl benzene which is used as the solvent, in the presence of azo molecule which is used as the initiator at 125° C. for three days, stirring the mixture at room temperature overnight, which is treated with hydrogen peroxide after precipitation to obtain the desired core structure of phosphorus-oxygen five-membered ring combined with a five-membered ring in the mother nucleus structure. By introducing the electron donating groups ($D_1$, $D_2$, $D_3$ and $D_4$) into the raw material 2,2',6,6'-tetrabromobiphenyl or bis(trimethyltin)phosphorobenzene, the compound as shown in Formula (I) of the present disclosure can be obtained.

The compound of Formula (I) of the present disclosure can be synthesized by the above method, but is not limited to the above method.

The present disclosure provides the methods for preparing several exemplary compounds. In the subsequent preparation examples, the synthesis of compounds P4, P10, P15, P17, P19, P30, and P31 is exemplarily described. The tetrahydrofuran used in the following preparation examples is anhydrous tetrahydrofuran.

Preparation Example 1

Synthesis of Compound P4

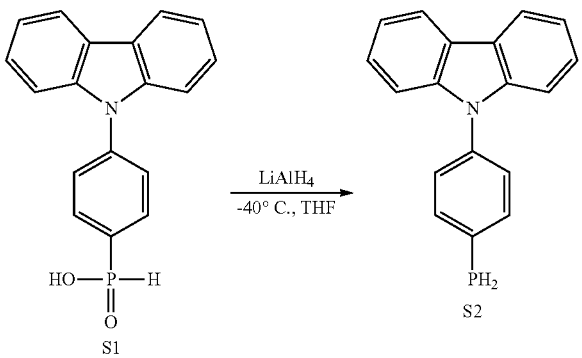

In a 250 mL three-necked flask, S1 (30 mmol), lithium aluminum hydride (60 mmol) and 100 mL tetrahydrofuran (THF) were firstly stirred at a certain speed, and the reactants in the resulting mixed solution were stirred at a reaction temperature of −40° C. for 5 h; after the reaction was completed, the temperature was returned to room temperature and 100 mL of water was added, the mixture was extracted with diethyl ether, the obtained organic phase was dried over anhydrous sodium sulfate, the solvent was distilled off, then the residue was purified using column chromatography to obtain intermediate S2 (24 mmol, 80%).

MALDI-TOF MS: m/z calcd for $C_{18}H_{14}NP$: 275.28; found: 275.09.

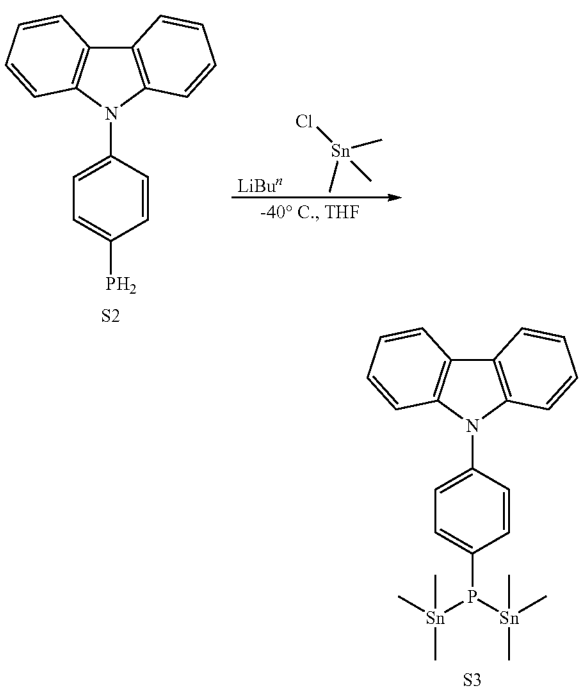

In a 250 mL three-necked flask, S2 (30 mmol) and 100 mL tetrahydrofuran were firstly stirred at a certain speed, the reactants in the resulting mixed solution were stirred at a reaction temperature of −40° C., and n-butyllithium ($LiBu^n$, 45 mmol) was added dropwise to the solution. After 1 hour of reaction, trimethyltin chloride (45 mmol) was added, and stirred at room temperature overnight. After the reaction was completed, 100 mL of water was added, the mixture was extracted with diethyl ether, the obtained organic phase was dried over anhydrous sodium sulfate, the solvent was distilled off, then the residue was purified using column chromatography to obtain intermediate S3 (24 mmol, 80%).

MALDI-TOF MS: m/z calcd for $C_{24}H_{30}NPSn_2$: 600.90; found: 600.26.

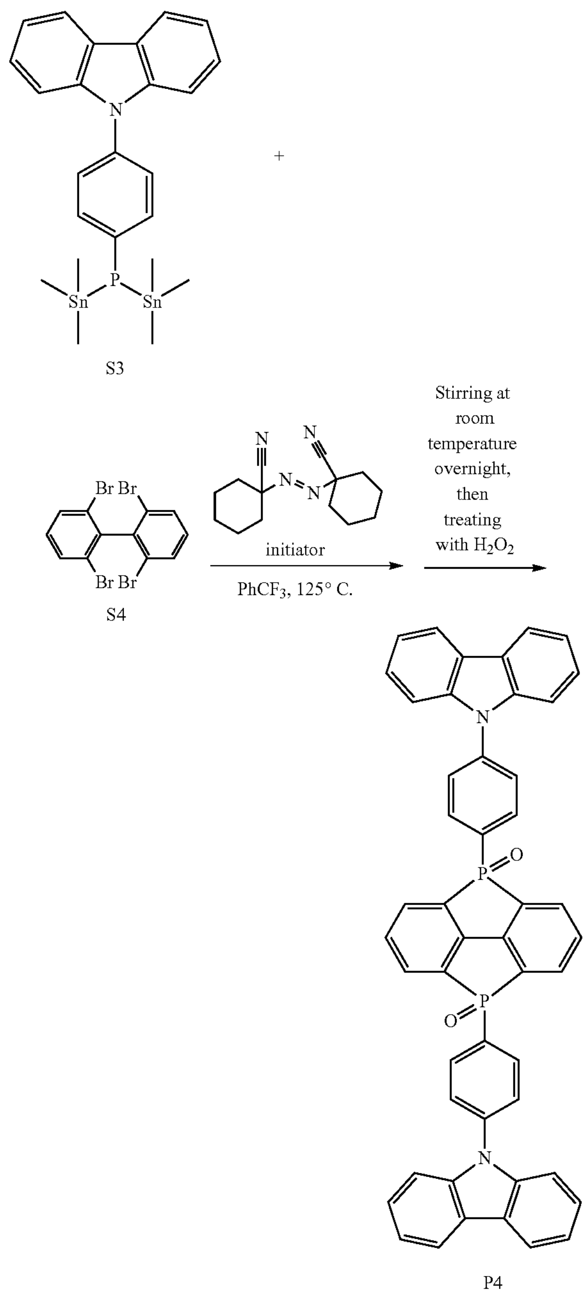

In a 250 mL three-necked flask, S3 (30 mmol) and S4 (15 mmol) were firstly dissolved in 100 mL of trifluoromethylbenzene solution, a small amount of azo radical initiator was added, and reacted at 125° C. for 3 days. After the reaction was completed, it was stirred at room temperature overnight. The precipitate was filtered and treated with hydrogen peroxide to obtain the product P4 (11 mmol, 73%).

MALDI-TOF MS: m/z calcd for $C_{48}H_{30}N_2O_2P_2$: 728.73; found: 728.18.

Element Analysis: C, 79.11; H, 4.11; N, 3.84; O, 4.39; P, 8.50. found C, 79.15; H, 4.10; N, 3.87; O, 4.42; P, 8.46.

Preparation Example 2

Synthesis of Compound P10

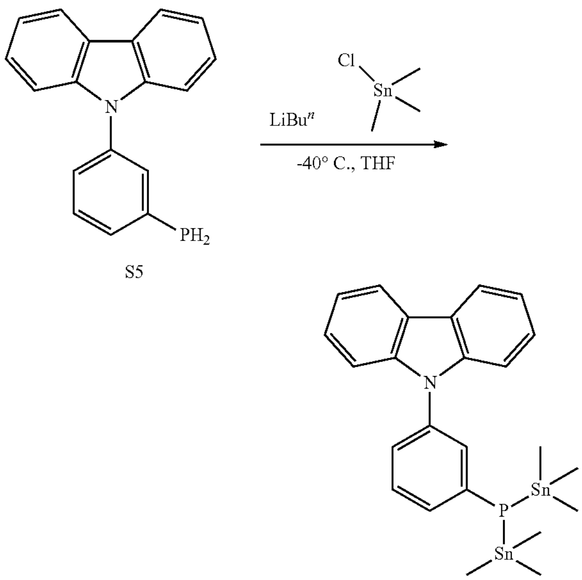

S5

S6

In a 250 mL three-necked flask, S5 (30 mmol), and 100 mL tetrahydrofuran were firstly stirred at a certain speed, the reactants in the resulting mixed solution were stirred at a reaction temperature of −40° C., and n-butyllithium (LiBu$^n$, 45 mmol) was added dropwise to the solution. After 1 hour of reaction, trimethyltin chloride (45 mmol) was added, and stirred at room temperature overnight. After the reaction was completed, 100 mL of water was added, the mixture was extracted with diethyl ether, the obtained organic phase was dried over anhydrous sodium sulfate, the solvent was distilled off, then the residue was purified using column chromatography to obtain intermediate S6 (24 mmol, 80%).

MALDI-TOF MS: m/z calcd for $C_{24}H_{30}NPSn_2$: 600.90; found: 600.26.

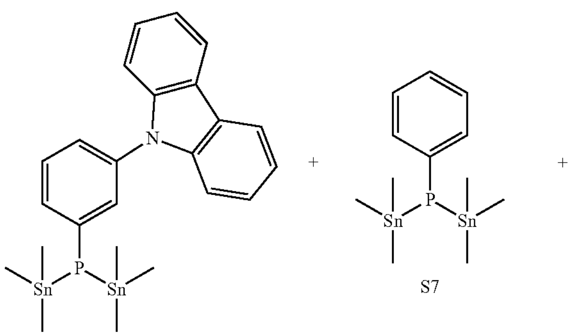

S6 S7

-continued

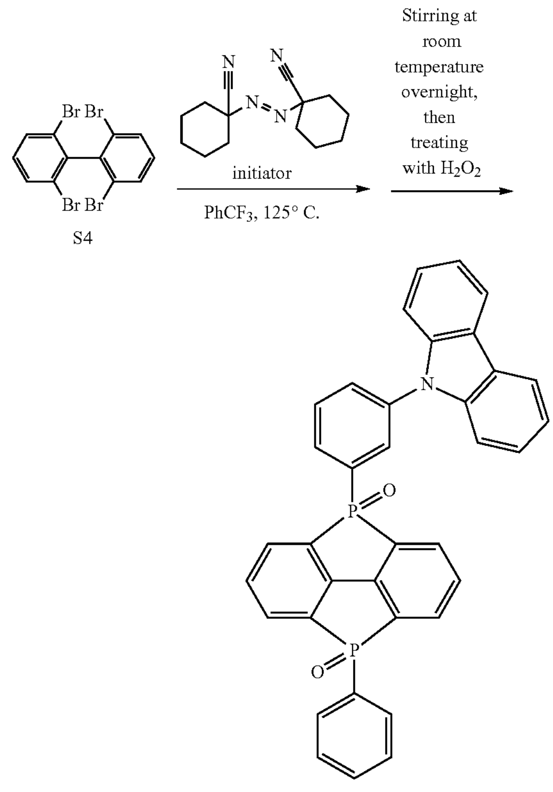

S4

P10

In a 250 mL three-necked flask, S6 (15 mmol), S7 (15 mmol) and S4 (15 mmol) were firstly dissolved in 100 mL of trifluoromethylbenzene solution, a small amount of azo radical initiator was added, and reacted at 125° C. for 3 days. After the reaction was completed, it was stirred at room temperature overnight. The precipitate was filtered and treated with hydrogen peroxide to obtain the product P10 (11 mmol, 73%).

MALDI-TOF MS: m/z calcd for $C_{36}H_{23}NO_2P_2$: 563.53; found: 563.12.

Element Analysis: C, 76.73; H, 4.11; N, 2.49; O, 5.68; P, 10.99. found C, 76.75; H, 4.12; N, 2.44; O, 5.69; P, 10.10.

Preparation Example 3

Synthesis of Compound P15

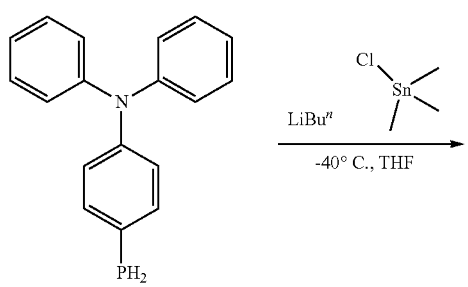

S8

-continued

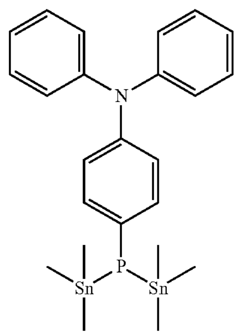

S9

In a 250 mL three-necked flask, S8 (30 mmol) and 100 mL tetrahydrofuran were firstly stirred at a certain speed, the reactants in the resulting mixed solution were stirred at a reaction temperature of −40° C., and n-butyllithium (LiBu$^n$, 45 mmol) was added dropwise to the solution. After 1 hour of reaction, trimethyltin chloride (45 mmol) was added, and stirred at room temperature overnight. After the reaction was completed, 100 mL of water was added, the mixture was extracted with diethyl ether, the obtained organic phase was dried over anhydrous sodium sulfate, the solvent was distilled off, then the residue was purified using column chromatography to obtain intermediate S9 (24 mmol, 80%).

MALDI-TOF MS: m/z calcd for $C_{24}H_{32}NPSn_2$: 602.91; found: 602.03.

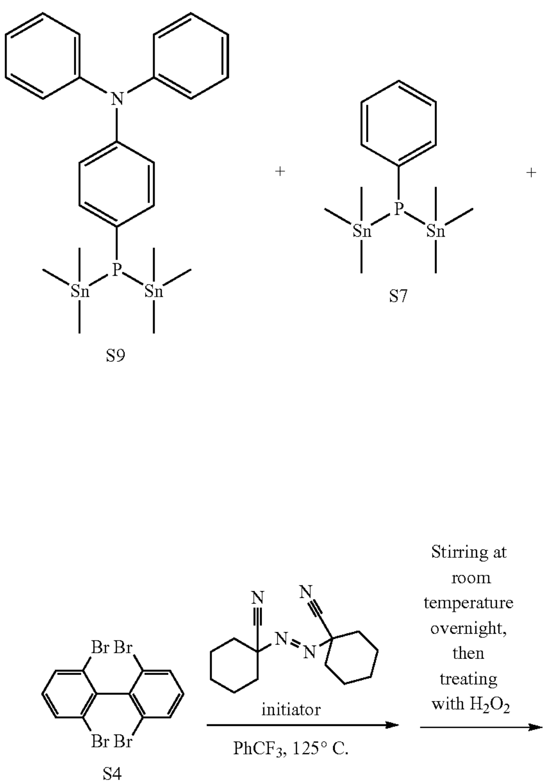

-continued

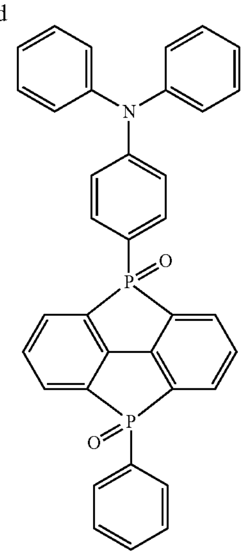

P15

In a 250 mL three-necked flask, S9 (15 mmol), S7 (15 mmol) and S4 (15 mmol) were firstly dissolved in 100 mL of trifluoromethylbenzene solution, a small amount of azo radical initiator was added, and reacted at 125° C. for 3 days. After the reaction was completed, it was stirred at room temperature overnight. The precipitate was filtered and treated with hydrogen peroxide to obtain the product P15 (11 mmol, 73%).

MALDI-TOF MS: m/z calcd for $C_{36}H_{25}NO_2P_2$: 565.54; found: 565.14.

Element Analysis: C, 76.46; H, 4.46; N, 2.48; O, 5.66; P, 10.95. found C, 76.42; H, 4.47; N, 2.48; O, 5.69; P, 10.94.

Preparation Example 4

Synthesis of Compound P17

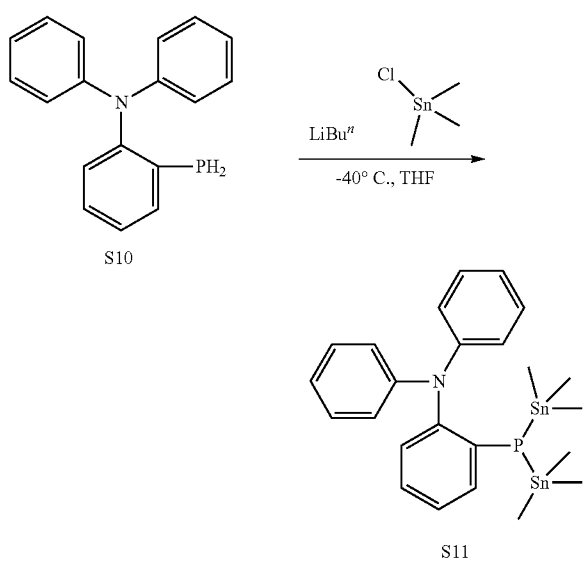

In a 250 mL three-necked flask, S10 (30 mmol) and 100 mL tetrahydrofuran were firstly stirred at a certain speed, the reactants in the resulting mixed solution were stirred at a reaction temperature of −40° C., and n-butyllithium (LiBu$^n$, 45 mmol) was added dropwise to the solution. After 1 hour of reaction, trimethyltin chloride (45 mmol) was added, and stirred at room temperature overnight. After the reaction was completed, 100 mL of water was added, the mixture was extracted with diethyl ether, the obtained organic phase was dried over anhydrous sodium sulfate, the solvent was distilled off, then the residue was purified using column chromatography to obtain intermediate S11 (24 mmol, 80%).

MALDI-TOF MS: m/z calcd for $C_{24}H_{32}NPSn_2$: 602.91; found: 602.03.

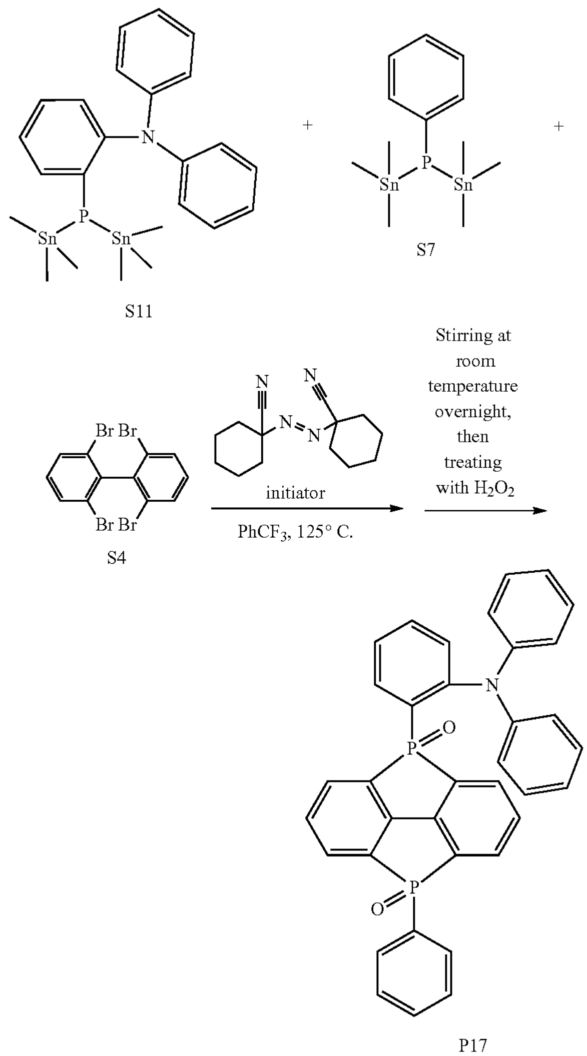

S11 S7 S4 P17

In a 250 mL three-necked flask, S11 (15 mmol), S7 (15 mmol) and S4 (15 mmol) were firstly dissolved in 100 mL of trifluoromethylbenzene solution, a small amount of azo radical initiator was added, and reacted at 125° C. for 3 days. After the reaction was completed, it was stirred at room temperature overnight. The precipitate was filtered and treated with hydrogen peroxide to obtain the product P17 (11 mmol, 73%).

MALDI-TOF MS: m/z calcd for $C_{36}H_{25}NO_2P_2$: 565.54; found: 565.14. Element Analysis: C, 76.46; H, 4.46; N, 2.48; O, 5.66; P, 10.95. found C, 76.42; H, 4.47; N, 2.48; O, 5.69; P, 10.94.

Preparation Example 5

Synthesis of Compound P19

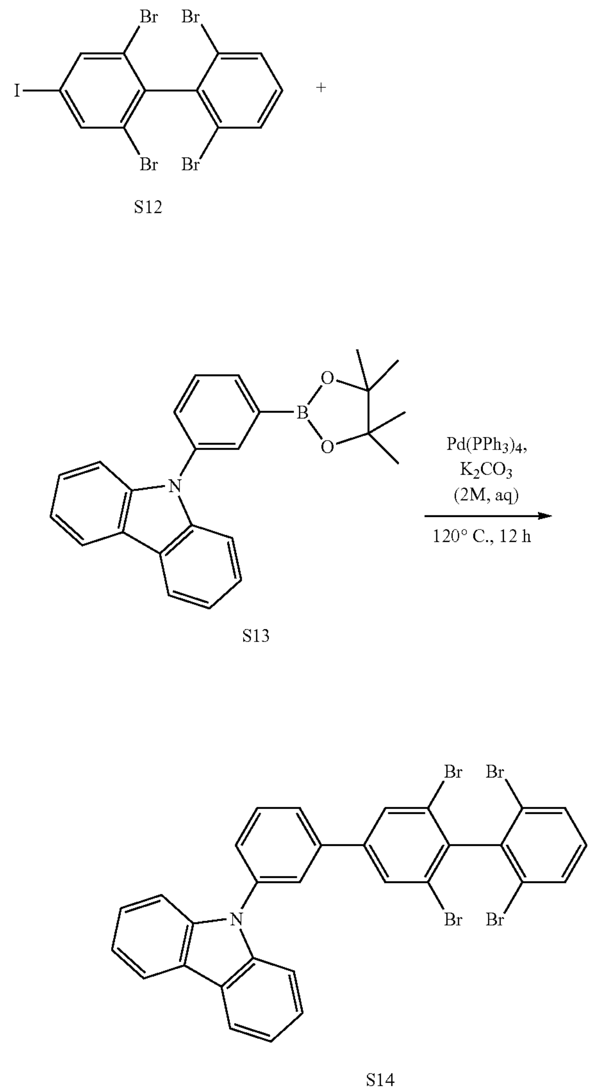

S12 S13 S14

Under protection of nitrogen, compounds S12 (18 mmol), S13 (18 mmol) and tetrakis(triphenylphosphine) palladium (0.2 mmol) as catalyst were weighed and added to a 250 mL two-necked flask. 60 mL of toluene was injected into a two-necked flask ($N_2$ was passed for 15 minutes in advance to remove oxygen), and then 5 mL of $K_2CO_3$ aqueous solution with a concentration of 2 M ($N_2$ was passed for 15 minutes in advance to remove oxygen) was added dropwise therein, and stirred at room temperature overnight. After the reaction was completed, 15 mL of deionized water was added, and a few drops of 2 M HCl were added dropwise. The mixture was extracted with dichloromethane, the organic phase was collected, and dried over anhydrous $Na_2SO_4$. The dried solution was filtered, and the solvent was removed on a rotary evaporator to obtain a crude product. The crude product was purified by a silica gel column chromatography, and finally purified to obtain solid S14 (13 mmol, 72%).

MALDI-TOF MS: m/z calcd for $C_{30}H_{17}Br_4N$: 711.08; found: 710.81.

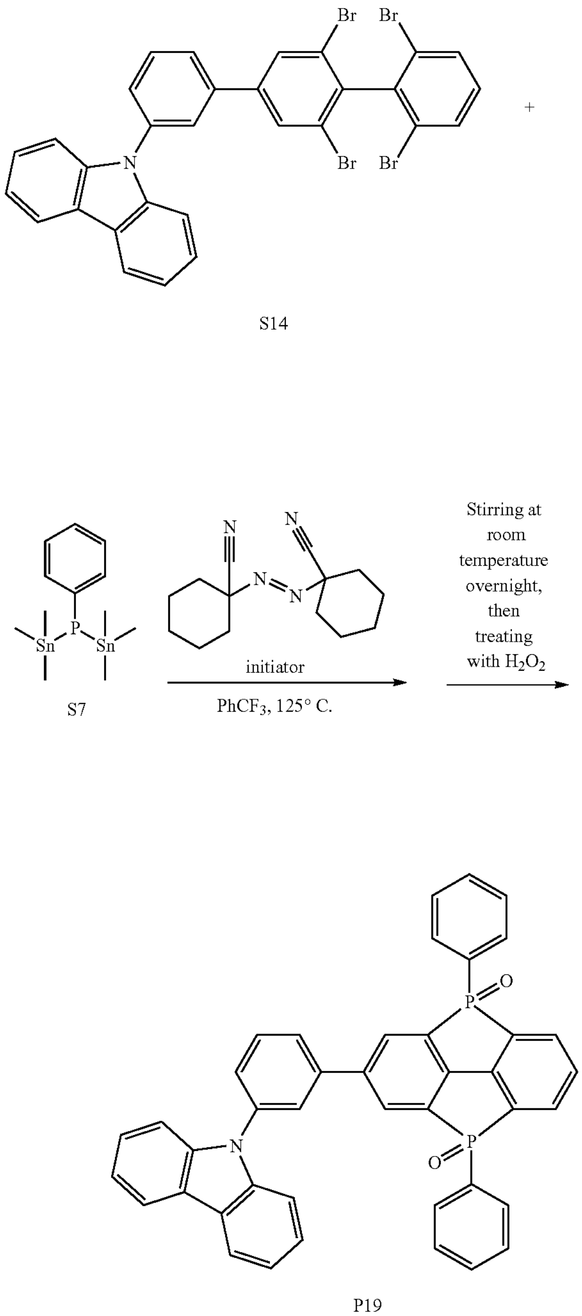

In a 250 mL three-necked flask, S14 (15 mmol) and S7 (30 mmol) were firstly dissolved in 100 mL of trifluoromethylbenzene solution, a small amount of azo radical initiator was added, and reacted at 125° C. for 3 days. After the reaction was completed, it was stirred at room temperature overnight. The precipitate was filtered and treated with hydrogen peroxide to obtain the product P19 (11 mmol, 73%).

MALDI-TOF MS: m/z calcd for $C_{42}H_{27}NO_2P_2$: 639.62; found: 639.15.

Element Analysis: C, 78.87; H, 4.25; N, 2.19; O, 5.00; P, 9.69. found C, 78.85; H, 4.23; N, 2.21; O, 5.04; P, 9.67.

Preparation Example 6

Synthesis of Compound P30

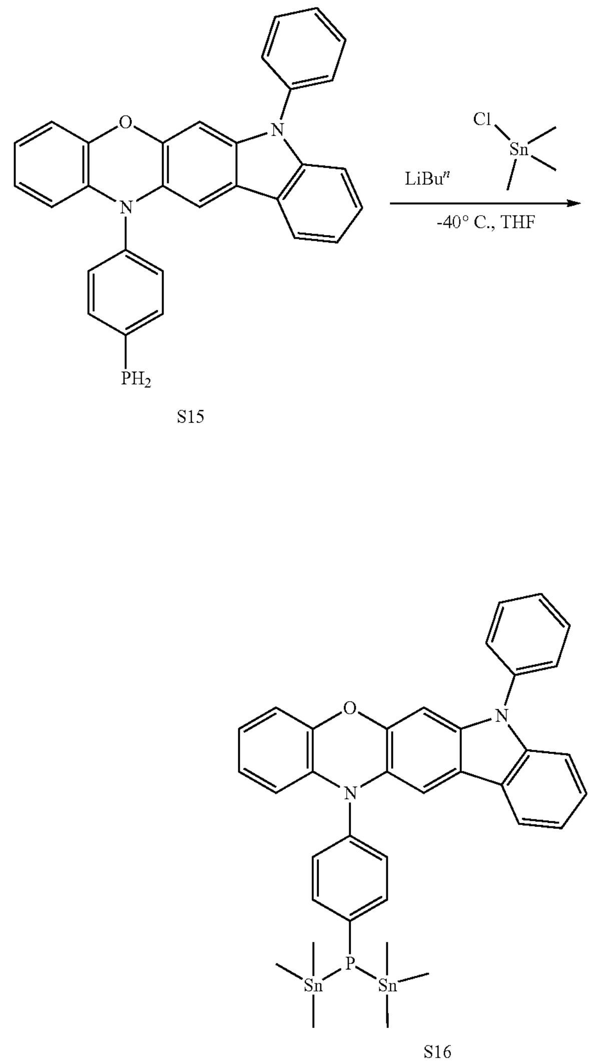

In a 250 mL three-necked flask, S15 (30 mmol) and 100 mL tetrahydrofuran were firstly stirred at a certain speed, the reactants in the resulting mixed solution were stirred at a reaction temperature of −40° C., and n-butyllithium (LiBu$^n$, 45 mmol) was added dropwise to the solution. After 1 hour of reaction, trimethyltin chloride (45 mmol) was added, and stirred at room temperature overnight. After the reaction was completed, 100 mL of water was added, the mixture was extracted with diethyl ether, the obtained organic phase was dried over anhydrous sodium sulfate, the solvent was distilled off, then the residue was purified using column chromatography to obtain intermediate S16 (24 mmol, 80%).

MALDI-TOF MS: m/z calcd for $C_{36}H_{37}N_2OPSn_2$: 782.09; found: 782.07.

-continued

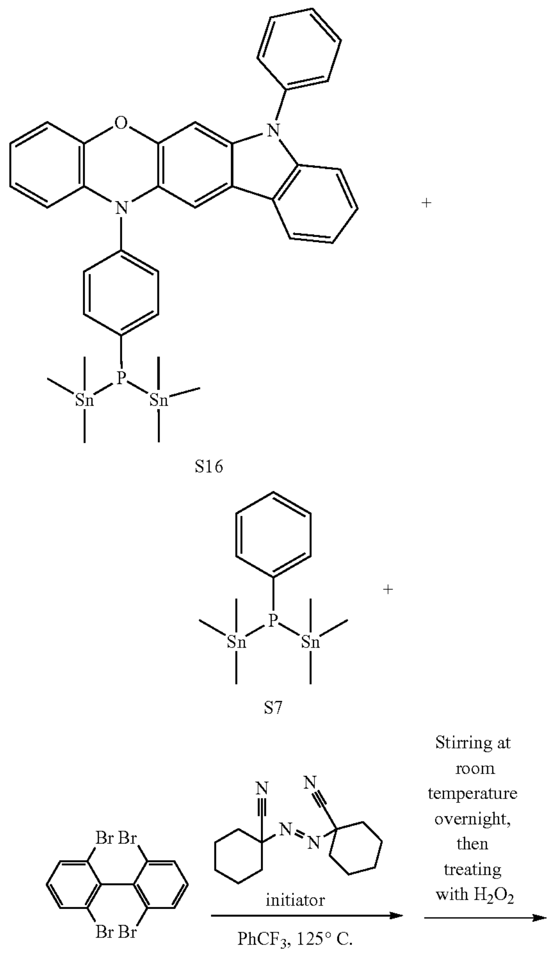

S16

S7

S4

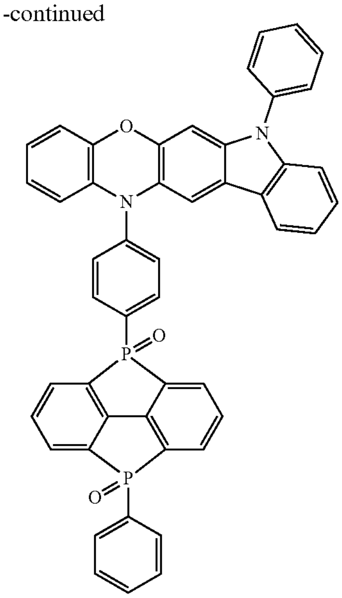

P30

In a 250 mL three-necked flask, S16 (15 mmol), S7 (15 mmol) and S4 (15 mmol) were firstly dissolved in 100 mL of trifluoromethylbenzene solution, a small amount of azo radical initiator was added, and reacted at 125° C. for 3 days. After the reaction was completed, it was stirred at room temperature overnight. The precipitate was filtered and treated with hydrogen peroxide to obtain the product P30 (11 mmol, 73%).

MALDI-TOF MS: m/z calcd for $C_{48}H_{30}N_2O_3P_2$: 744.71; found: 744.17.

Element Analysis: C, 77.41; H, 4.06; N, 3.76; O, 6.45; P, 8.32. found C, 77.42; H, 4.09; N, 3.72; O, 6.47; P, 8.30.

Preparation Example 7

Synthesis of Compound P31

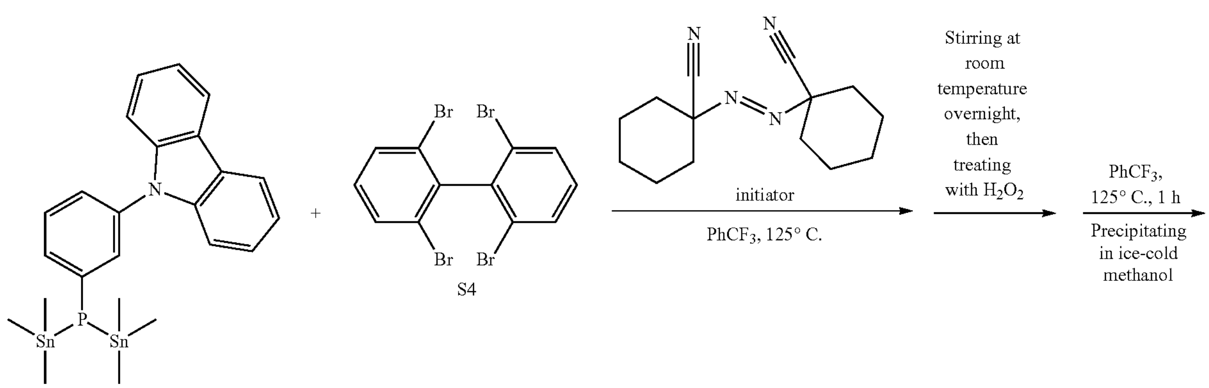

S6

-continued

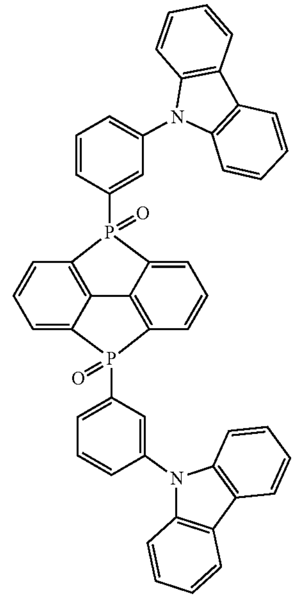

P31

In a 250 mL three-necked flask, S6 (30 mmol) and S4 (15 mmol) were firstly dissolved in 100 mL of trifluoromethylbenzene solution, a small amount of azo radical initiator was added, and reacted at 125° C. for 3 days. After the reaction was completed, it was stirred at room temperature overnight. The precipitate was filtered and treated with hydrogen peroxide. The precipitate was collected, oven-dried, and refluxed for another 1 h in trifluoromethyl benzene, and quickly precipitated in ice-cold methanol to obtain the product P31 (9 mmol, 60%).

MALDI-TOF MS: m/z calcd for $C_{48}H_{30}N_2O_2P_2$: 728.71; found: 728.18.

Element Analysis: C, 79.11; H, 4.15; N, 3.84; O, 4.39; P, 8.50. found C, 79.11; H, 4.15; N, 3.84; O, 4.39; P, 8.50.

Comparative Preparation Example 1

Synthesis of Compound C2

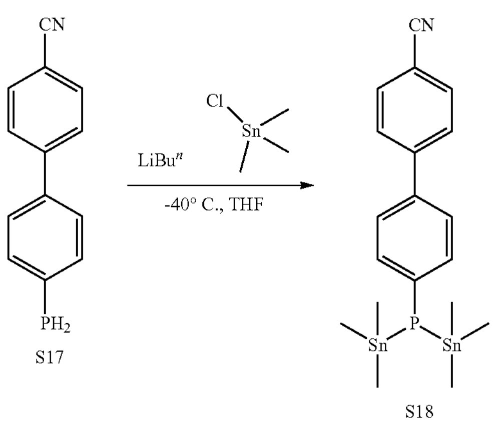

In a 250 mL three-necked flask, S17 (30 mmol) and 100 mL tetrahydrofuran were firstly stirred at a certain speed, the reactants in the resulting mixed solution were stirred at a reaction temperature of −40° C., and n-butyllithium (LiBu$^n$, 45 mmol) was added dropwise to the solution. After 1 hour of reaction, trimethyltin chloride (45 mmol) was added, and stirred at room temperature overnight. After the reaction was completed, 100 mL of water was added, the mixture was extracted with diethyl ether, the obtained organic phase was dried over anhydrous sodium sulfate, the solvent was distilled off, then the residue was purified using column chromatography to obtain intermediate S18 (24 mmol, 80%).

MALDI-TOF MS: m/z calcd for $C_{19}H_{26}NPSn_2$: 536.81; found: 536.98.

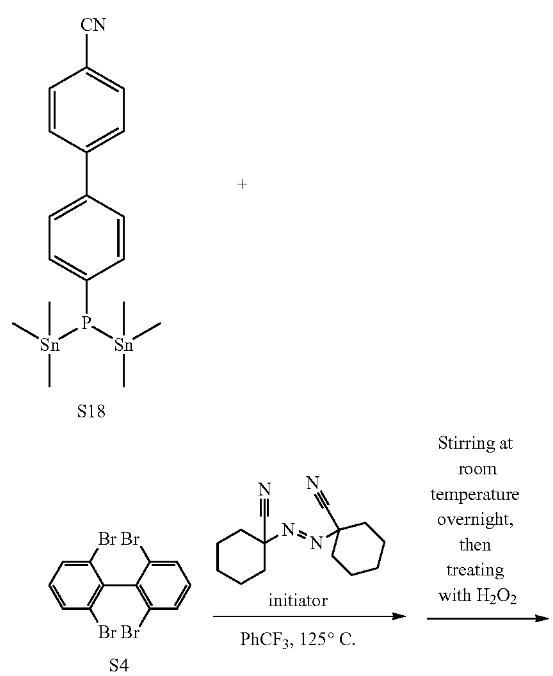

-continued

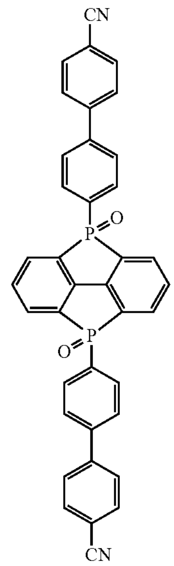

C2

In a 250 mL three-necked flask, S18 (30 mmol) and S4 (15 mmol) were firstly dissolved in 100 mL of trifluoromethylbenzene solution, a small amount of azo radical initiator was added, and reacted at 125° C. for 3 days. After the reaction was completed, it was stirred at room temperature overnight. The precipitate was filtered and treated with hydrogen peroxide. The precipitate was collected, oven-dried, and refluxed for another 1 h in trifluoromethyl benzene, and quickly precipitated in ice-cold methanol to obtain the product C2 (9 mmol, 60%).

MALDI-TOF MS: m/z calcd for $C_{38}H_{22}N_2O_2P_2$: 600.54; found: 600.12.

Element Analysis: C, 76.00; H, 3.69; N, 4.66; O, 5.33; P, 10.32. found C, 76.02; H, 3.66; N, 4.64; O, 5.34; P, 10.34.

Performance Test

Simulation Calculation of Compounds

Based on the density functional theory (DFT), for the compounds of the present disclosure used in the examples and comparative examples, the distribution of molecular frontier orbital was calculated and optimized using the Gaussian 09 program package at the B3LYP/6-31G (d) calculation level. At the same time, based on the time-dependent density functional theory (TD-DFT), the singlet energy level $S_1$ and the triplet energy level $T_1$ of the molecules were simulated and calculated. The results are shown in Table 1, wherein $\Delta E_{ST}=S_1-T_1$, $E_g$=HOMO-LUMO, the numerical value of $E_g$ takes the absolute value.

TABLE 1

| Compounds | HOMO (eV) | LUMO (eV) | $S_1$ (eV) | $T_1$ (eV) | $\Delta E_{ST}$ (eV) | $E_g$ (eV) |
|---|---|---|---|---|---|---|
| P4 | −5.535 | −1.905 | 3.50 | 2.74 | 0.76 | 3.63 |
| P10 | −5.437 | −1.832 | 3.39 | 2.74 | 0.65 | 3.60 |
| P15 | −5.247 | −1.668 | 3.36 | 2.95 | 0.41 | 3.58 |
| P17 | −5.233 | −1.640 | 3.17 | 2.71 | 0.46 | 3.59 |
| P19 | −5.407 | −1.870 | 3.35 | 2.58 | 0.77 | 3.54 |
| P30 | −4.528 | −1.862 | 2.571 | 2.570 | 0.001 | 2.67 |
| C2 | −5.821 | −2.456 | 3.016 | 2.191 | 0.825 | 3.365 |

As can be seen from Table 1, the materials of phosphorus-oxygen five-membered ring combined with a five-membered ring designed in this application have deep singlet and triplet energy levels, which are suitable for the host material in the blue light-emitting layer.

To facilitate the understanding of the present disclosure, the following embodiments of the organic photoelectric device are listed in the present disclosure. It will be apparent to those skilled in the art that the embodiments are merely illustrations of the present disclosure and should not be construed as specific limitations to the present disclosure.

As shown in the FIGURE, another embodiment of the present disclosure provides an organic photoelectric device, the organic photoelectric device including: a substrate 1, an ITO anode 2, a hole injection layer 3, a hole transport layer 4, a light-emitting layer 5, an electron transport layer 6, an electron injection layer 7, a cathode 8 (magnesium-silver electrode, with a mass ratio of Mg—Ag of 9:1) and a cap layer (CPL) 9, where the thickness of the ITO anode 2 is 15 nm, the thickness of the hole injection layer 3 is 10 nm, the thickness of the hole transport layer 4 is 110 nm, the thickness of the light-emitting layer 5 is 30 nm, the thickness of the electron transport layer 6 is 30 nm, the thickness of the electron injection layer 7 is 5 nm, the thickness of the cathode 8 is 15 nm, and the thickness of the cap layer 9 is 100 nm. The arrows in the FIGURE represent the light emitting direction of the organic electroluminescent device.

Example 1

The compound of the present disclosure was used as a blue light host material in this Example to prepare an organic photoelectric device. The specific preparation steps are as follows:

(1) cutting the glass substrate into a size of 50 mm×50 mm×0.7 mm, sonicating in isopropanol and deionized water for 30 minutes, respectively, and then exposing to ozone for about 10 minutes for cleaning; mounting the obtained glass substrate having indium tin oxide (ITO) anode to a vacuum deposition apparatus;

2) evaporating the hole injection layer material HAT-CN on the ITO anode layer 2 by vacuum evaporation mode to a thickness of 10 nm, this layer serving as the hole injection layer 3;

3) vacuum evaporating the hole transport layer material TAPC on the hole injection layer 3 to a thickness of 110 nm, which serves as the hole transport layer 4;

4) vacuum evaporating a light-emitting layer 5 on the hole transport layer 4, wherein compound P4 was used as a host material, BCzVBi was used as a fluorescent doping material, the doping ratio was 3% (in mass ratio), and the thickness was 30 nm;

5) vacuum evaporating the electron transport layer material TPBI on the light-emitting layer 5 to a thickness of 30 nm, which serves as the electron transport layer 6;

6) vacuum evaporating the electron injection layer material $Alq_3$ on the electron transport layer 6 to a thickness of 5 nm, which serves as the electron injection layer 7;

7) vacuum evaporating a magnesium-silver electrode as the cathode 8 on the electron injection layer 7, wherein the mass ratio of Mg:Ag was 9:1, and the thickness was 15 nm;

8) vacuum evaporating HT on the cathode 8 to a thickness of 100 nm, which serves as the cap layer 9.

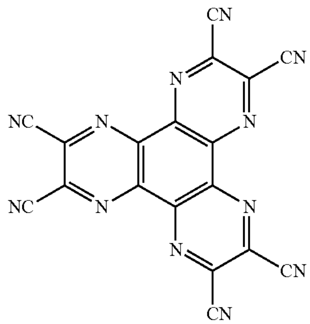

HAT—CN

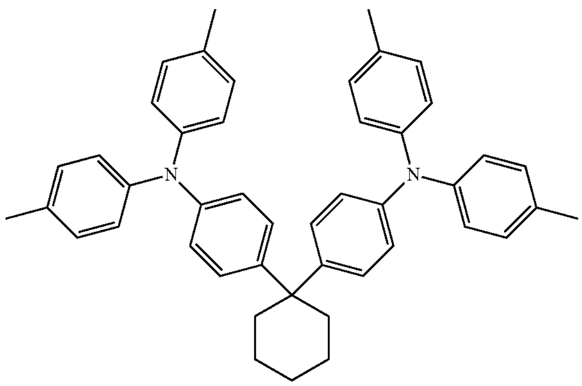

TAPC

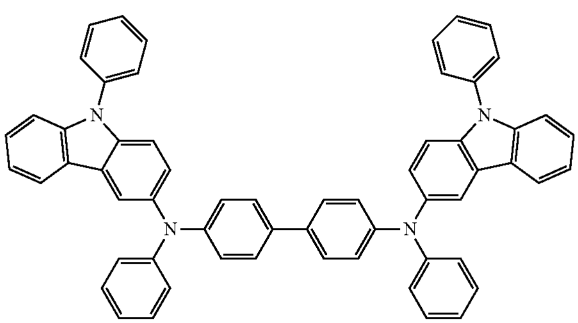

HT

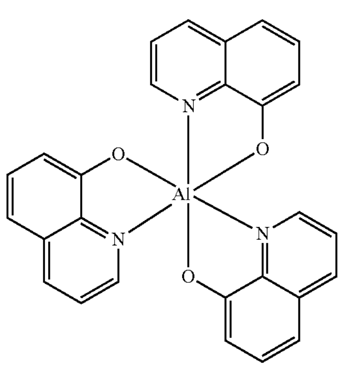

$Alq_3$

-continued

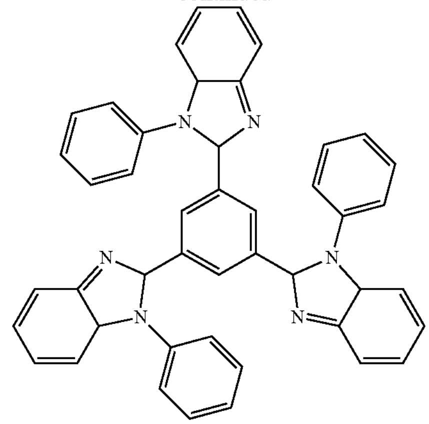

TPBI

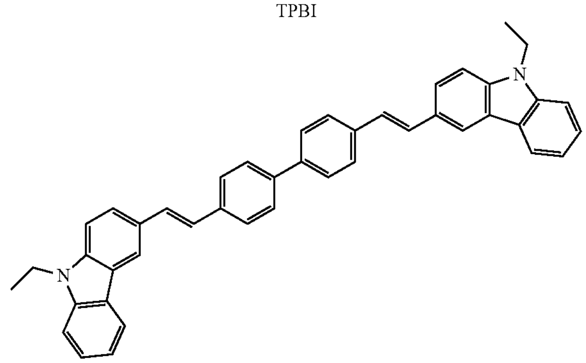

BCzVBi

In summary, Example 2 to Example 6 and Comparative Examples 1-2 differ from Example 1 merely in that the light-emitting layer host material is replaced, specifically as shown in Table 2.

The structure of the compound of Comparative Example 1 is as follows:

C1

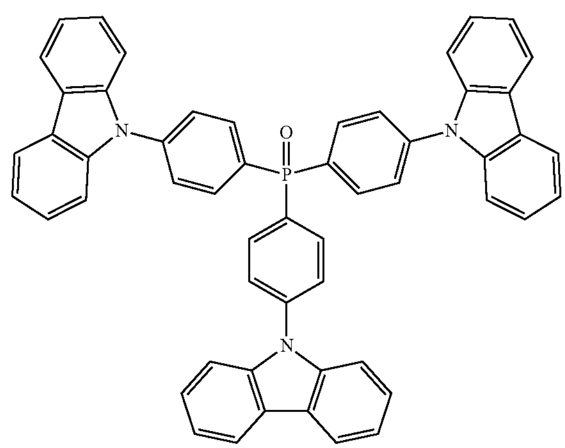

Performance Test Performance Evaluation of Organic Photoelectric Device

The Keithley 2365A digital nanovoltmeter was used to test the currents of the organic photoelectric devices manufactured according to the Examples and Comparative Examples at different voltages, and then the current was divided by the light-emitting area to obtain the current density of the organic photoelectric devices at different voltages. The Konicaminolta CS-2000 spectroradiometer was used to test the luminance and radiant energy flux density of the organic optoelectronic devices manufactured according to the Examples and the Comparative examples under different voltages. According to the current density and luminance of the organic optoelectronic devices under different voltages, the current efficiency (CE, cd $A^{-1}$) at the same current density (10 mA/$cm^2$) is obtained; The voltage corresponding to 10 mA/$cm^2$ in the measured current-voltage-luminance curve above is the driving voltage $V_{on}$ of the device. The above test results are shown in Table 2.

TABLE 2

| | Light-emitting layer host material | $V_{on}$[V] | $CE_{(10mA/cm^2)}$(cd $A^{-1}$) |
|---|---|---|---|
| Example 1 | P4 | 3.42 | 6.83 |
| Example 2 | P10 | 3.56 | 6.92 |
| Example 3 | P15 | 3.63 | 6.48 |
| Example 4 | P17 | 3.58 | 6.82 |
| Example 5 | P19 | 3.72 | 6.76 |
| Example 6 | P30 | 3.75 | 6.34 |
| Comparative Example 1 | C1 | 4.65 | 5.67 |
| Comparative Example 2 | C2 | 4.78 | 5.45 |

As can be seen from Table 2, the devices made of the materials designed in this application have lower driving voltage and higher efficiency. This is due to the combination of the electron-withdrawing structure of phosphorus-oxygen five-membered ring combined with a five-membered ring and the donor material, resulting in better electron and hole transport rates, balancing the concentration of carrier in the light-emitting layer and reducing the aggregation of single carrier, which reduces the operating voltage and improves the luminous efficiency of the device.

Although the detailed process equipment and process flow of the present disclosure have been described by the above embodiments in the present disclosure, the present disclosure is not limited thereto, that is to say, it is not meant that the present disclosure has to be implemented depending on the above detailed process equipment and process flow. It will be apparent to those skilled in the art that any improvements made to the present disclosure, equivalent replacements and addition of adjuvant ingredients to the raw materials of the products of the present disclosure, and selections of the specific implementations, etc., all fall within the protection scope and the disclosed scope of the present disclosure.

What is claimed is:

1. A compound, having a structure of Formula (II-1), Formula (II-2) or Formula (II-5):

Formula (II-1)

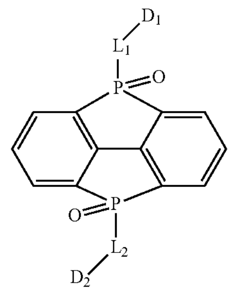

Formula (II-2)

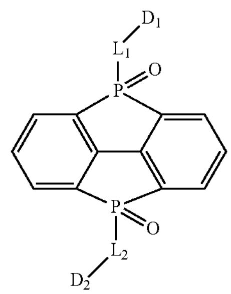

(Formula II-5)

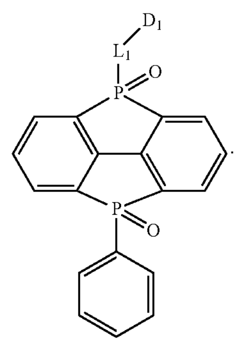

wherein:

$L_1$ and $L_2$ are each independently selected from any one of a single bond, a substituted or unsubstituted C6-C40 arylene group, and a substituted or unsubstituted C3-C40 heteroarylene group; and $D_1$ and $D_2$ are each independently selected from any one of a substituted or unsubstituted C4-C40 carbazole group, a substituted or unsubstituted C4-C40 acridine group, a substituted or unsubstituted C6-C40 arylamine group, a substituted or unsubstituted fluorenyl group, a substituted or unsubstituted spirofluorenyl group, a substituted or unsubstituted diphenyl ether group, and a substituted or unsubstituted diindolocyclopentadiene group, and the $D_1$ and $D_2$ are all electron-donating groups;

wherein when a substituent is present in any one of said groups, the substituent includes any one or a combination of at least two of cyano, halogen, phenoxy, C1-C20 alkyl group, C1-C20 alkoxyl group, C6-C40 aryl group, C4-C40 heteroaryl group, and C6-C40 arylamine group.

2. The compound according to claim 1, wherein the substituted or unsubstituted C4-C40 carbazole group includes the following groups:

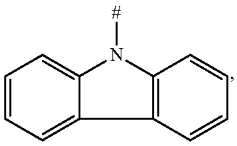

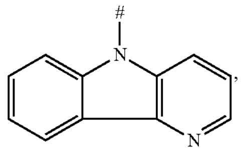

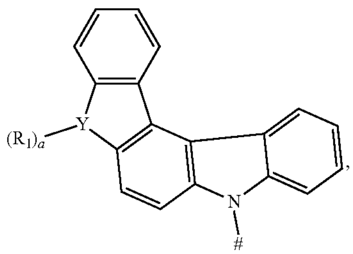

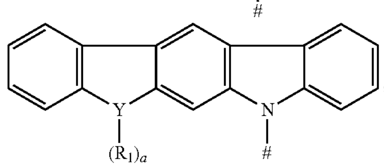

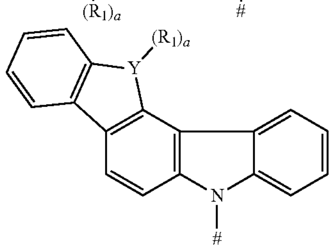

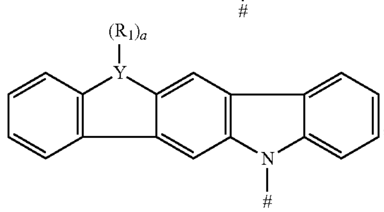

wherein Y is independently selected from any one of a carbon atom, a nitrogen atom, an oxygen atom, a sulfur atom, and a silicon atom;

wherein a is selected from an integer of 0-2;

wherein $R_1$ is selected from any one of a hydrogen atom, a substituted or unsubstituted C1-C20 alkyl group, a substituted or unsubstituted C1-C20 alkoxyl group, a substituted or unsubstituted C6-C30 aryl group, and a substituted or unsubstituted C3-C30 heteroaryl group;

wherein when a substituent is present in the substituted C4-C40 carbazole group, the substituent includes any one or a combination of at least two of cyano, halogen, phenoxy, C1-C20 alkyl group, C1-C20 alkoxyl group, C6-C40 aryl group, C4-C40 heteroaryl group, and C6-C40 arylamine group; and wherein # represents the linking site of the group.

3. The compound according to claim 1, wherein the substituted or unsubstituted C4-C40 acridine group includes the following groups:

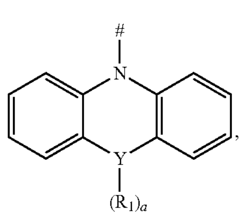

-continued

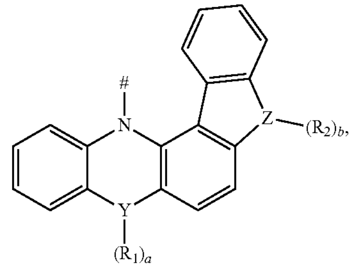

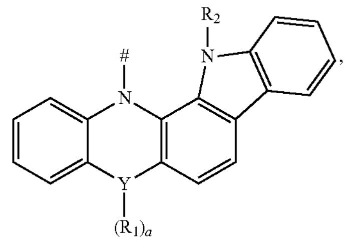

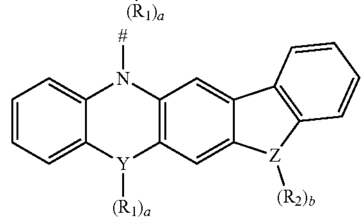

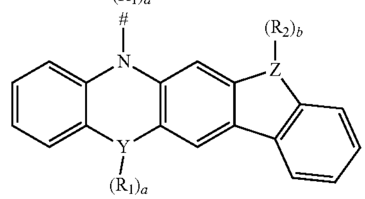

wherein Y and Z are each independently selected from any one of a carbon atom, a nitrogen atom, an oxygen atom, a sulfur atom, and a silicon atom;

wherein a and b are each independently selected from an integer of 0-2;

wherein $R_1$ and $R_2$ are each independently selected from any one of a hydrogen atom, a substituted or unsubstituted C1-C20 alkyl group, a substituted or unsubstituted C1-C20 alkoxyl group, a substituted or unsubstituted C6-C30 aryl group, and a substituted or unsubstituted C3-C30 heteroaryl group;

wherein when a substituent is present in the substituted C4-C40 acridine group, the substituent includes any one or a combination of at least two of cyano, halogen, phenoxy, C1-C20 alkyl group, C1-C20 alkoxyl group, C6-C40 aryl group, C4-C40 heteroaryl group, and C6-C40 arylamine group; and wherein # represents the linking site of the group.

4. The compound according to claim 1, wherein the substituted or unsubstituted C6-C40 arylamine group includes the following group:

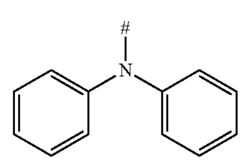

wherein when a substituent is present in the substituted C6-C40 arylamine group, the substituent includes any one or a combination of at least two of cyano, halogen, phenoxy, C1-C20 alkyl group, C1-C20 alkoxyl group, C6-C40 aryl group, C4-C40 heteroaryl group, and C6-C40 arylamine group; and wherein # represents the linking site of the group.

5. The compound according to claim 1, wherein $D_1$ and $D_2$ are each further independently selected from any one of the following groups which are substituted or unsubstituted:

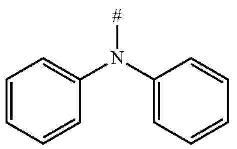

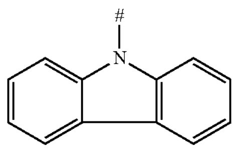

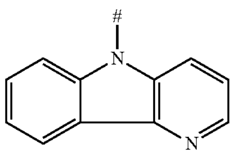

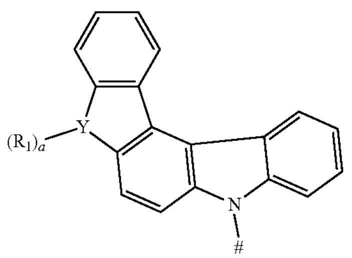

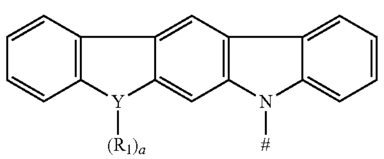

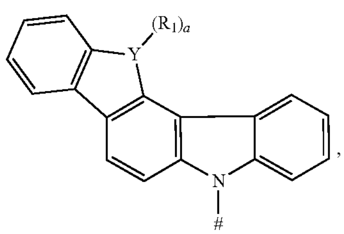

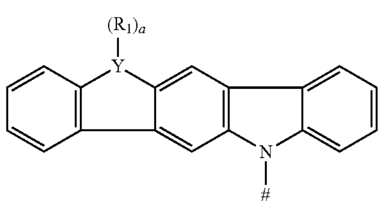

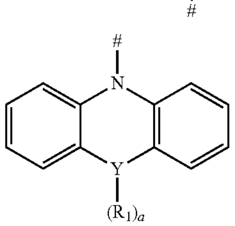

-continued

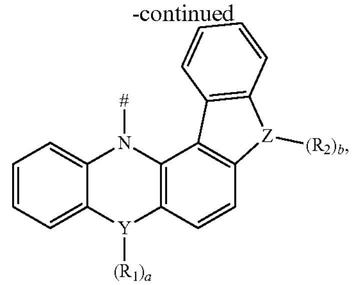

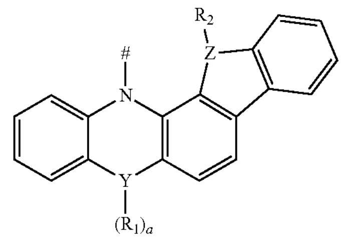

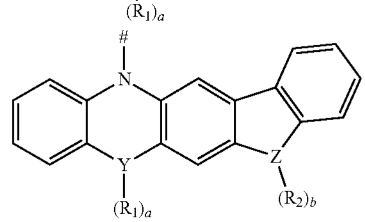

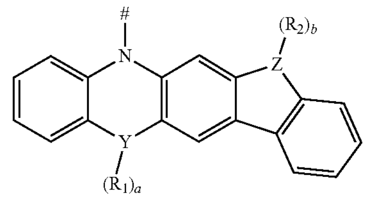

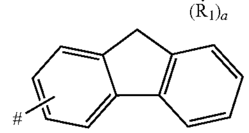

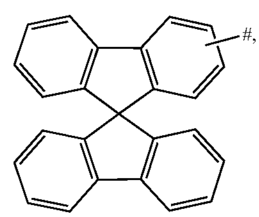

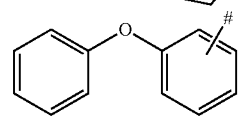

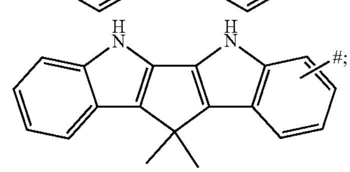

wherein Y and Z are each independently selected from any one of a carbon atom, a nitrogen atom, an oxygen atom, a sulfur atom, and a silicon atom;

wherein a and b are each independently selected from an integer of 0-2;

wherein $R_1$ and $R_2$ are each independently selected from any one of a hydrogen atom, a substituted or unsubstituted C1-C20 alkyl group, a substituted or unsubstituted C1-C20 alkoxyl group, a substituted or unsubstituted C6-C30 aryl group, and a substituted or unsubstituted C3-C30 heteroaryl group;

wherein when a substituent is present in the substituted group of $D_1$ or $D_2$, the substituent includes any one or a combination of at least two of cyano, halogen, phenoxy, C1-C20 alkyl group, C1-C20 alkoxyl group, C6-C40 aryl group, C4-C40 heteroaryl group, and C6-C40 arylamine group; and wherein # represents the linking site of the group.

6. The compound according to claim 1, wherein the $D_1$ and $D_2$ are each independently selected from any one of the following groups:

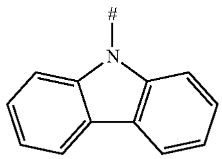

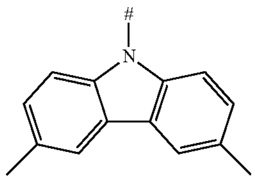

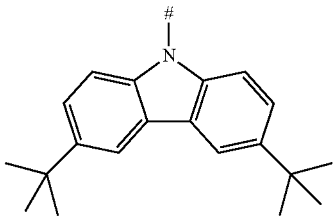

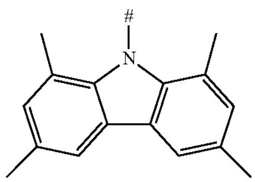

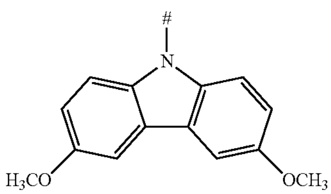

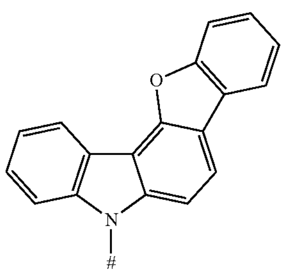

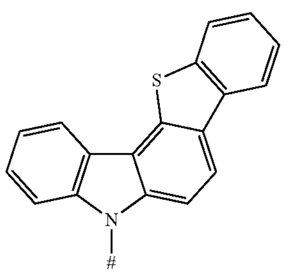

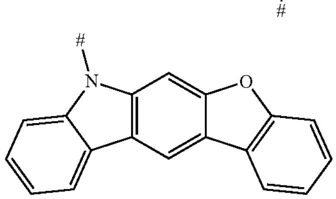

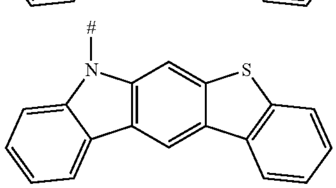

-continued

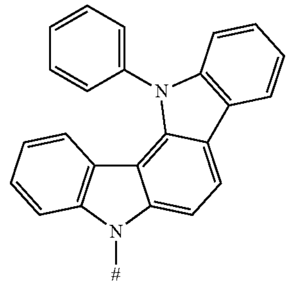

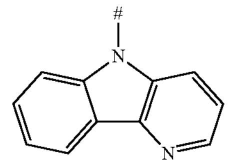

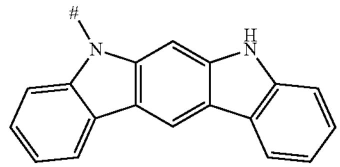

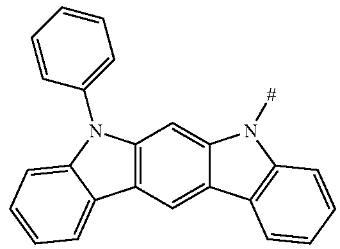

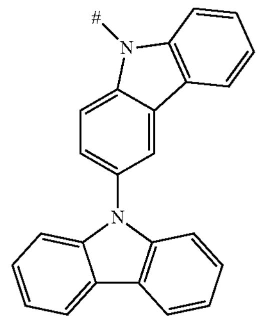

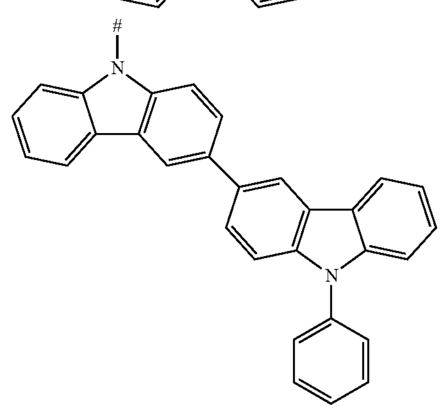

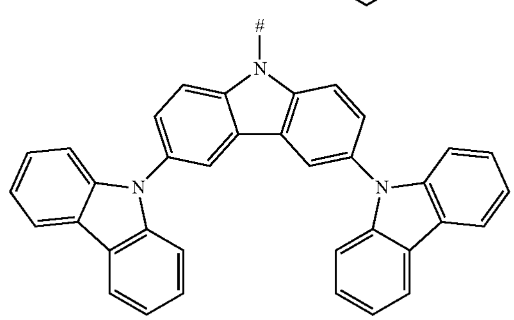

-continued
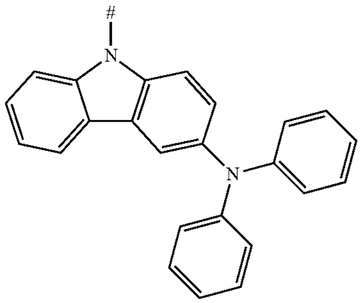
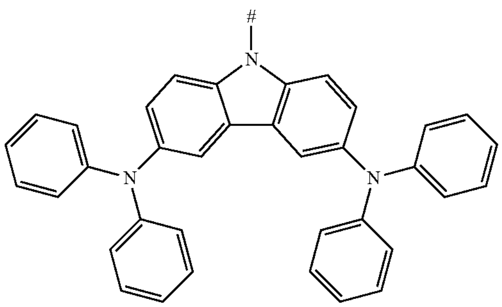
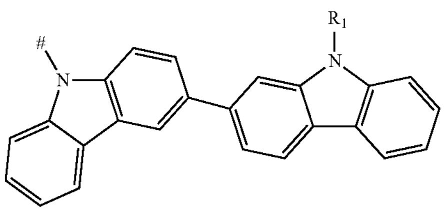
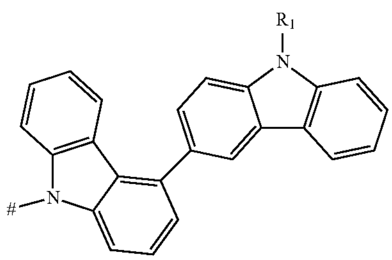
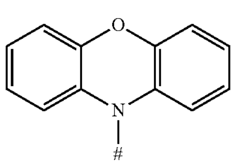
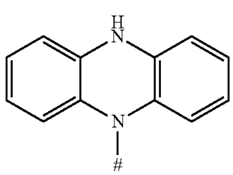
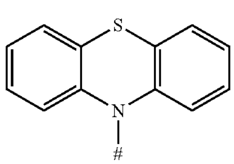
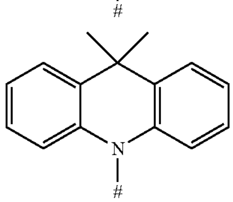
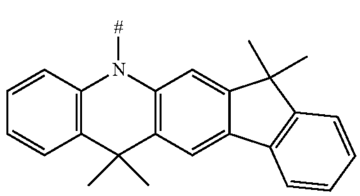
-continued
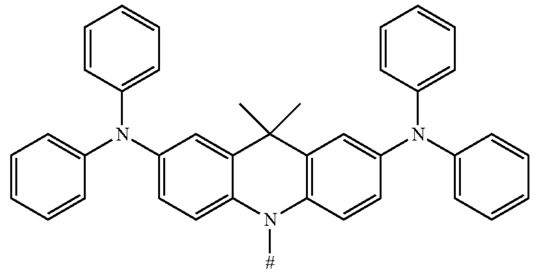
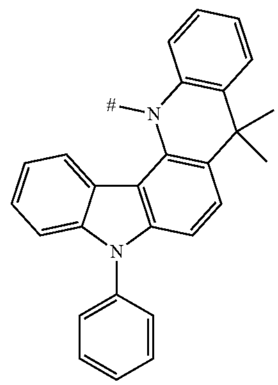
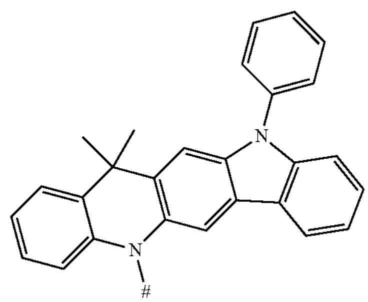
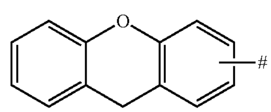
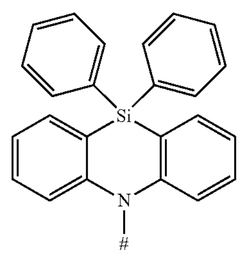
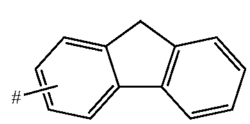
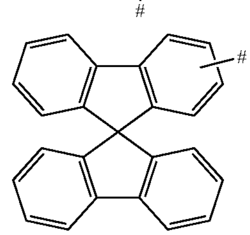
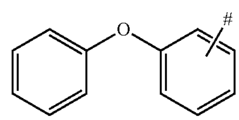
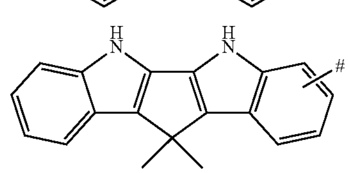

-continued

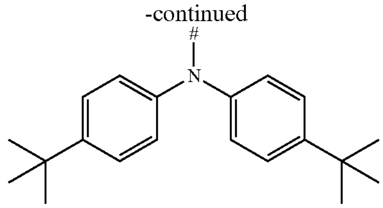

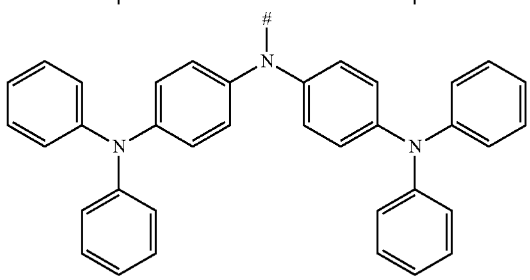

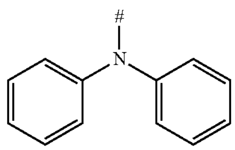

wherein $R_1$ is selected from any one of a hydrogen atom, a substituted or unsubstituted C1-C20 alkyl group, a substituted or unsubstituted C1-C20 alkoxyl group, a substituted or unsubstituted C6-C30 aryl group, and a substituted or unsubstituted C3-C30 heteroaryl group;

when a substituent is present in the substituted group of $D_1$ or $D_2$, the substituent includes any one or a combination of at least two of cyano, halogen, phenoxy, C1-C20 alkyl group, C1-C20 alkoxyl group, C6-C40 aryl group, C4-C40 heteroaryl group, and C6-C40 arylamine group; and wherein # represents the linking site of the group.

7. The compound according to claim 1, wherein $L_1$ and $L_2$ are each independently selected from any one of a single bond, a phenylene group, a thienylene group, a naphthylene group, an anthrylene group, a phenanthrylene group, or a pyrenylene group.

8. The compound according to claim 1, wherein $L_1$ and $L_2$ are each independently selected from a single bond, or a phenylene group.

9. The compound according to claim 1, wherein the compound has any one of the following structures:

P1

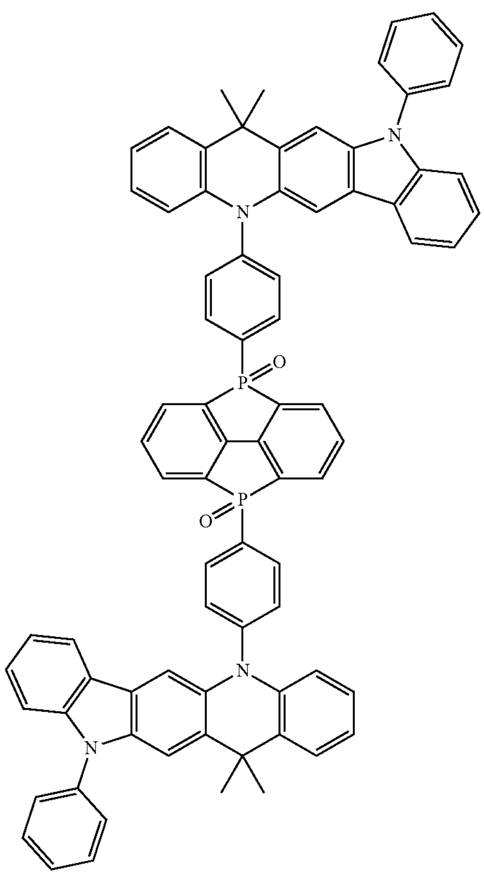

P2

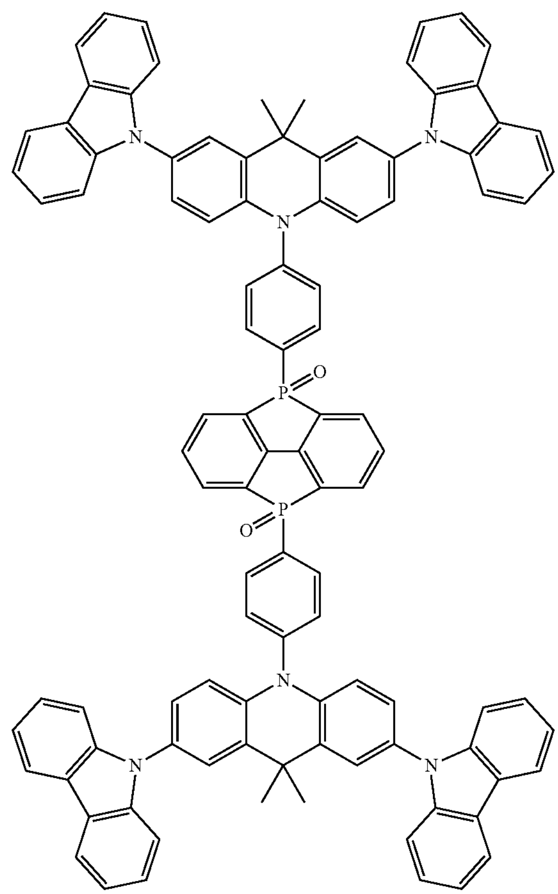

-continued
P3
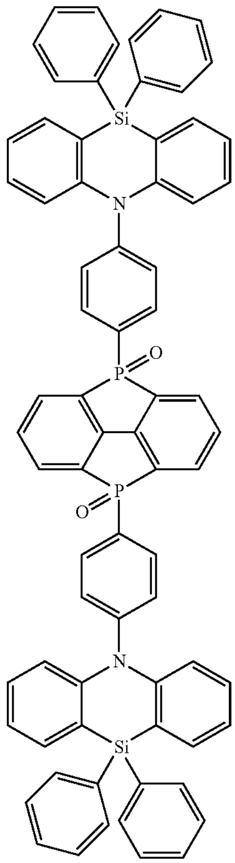
P4
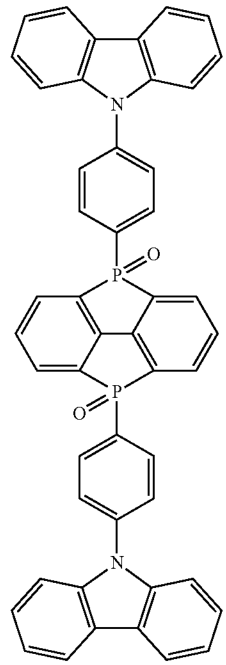
P5
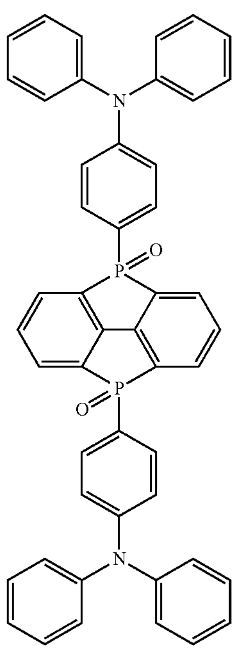
P9
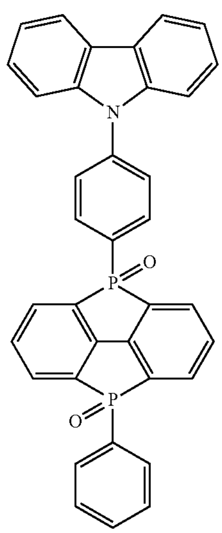

-continued
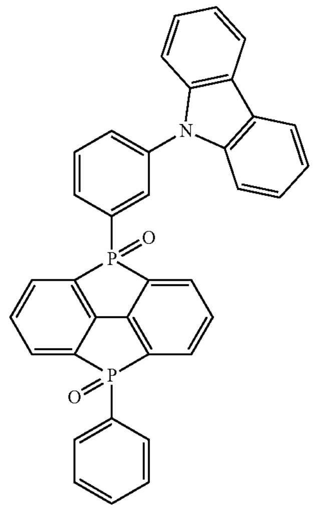
P10
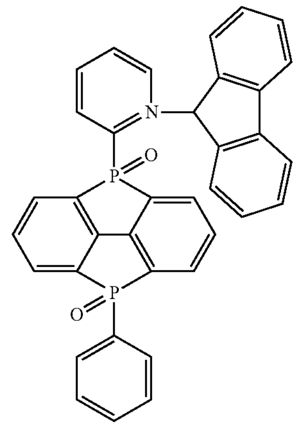
P11
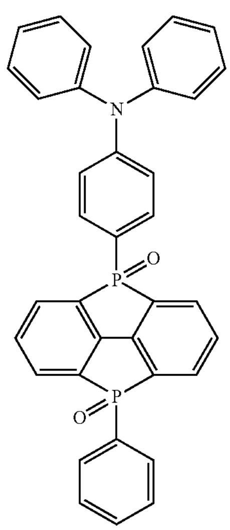
P15
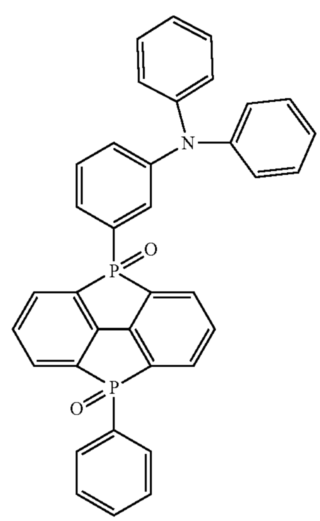
P16

-continued
P17
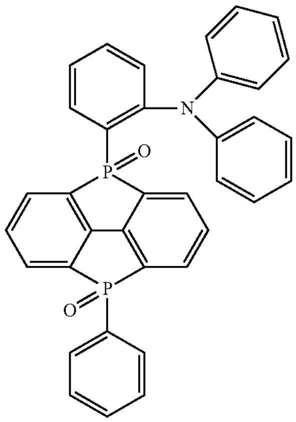
P26
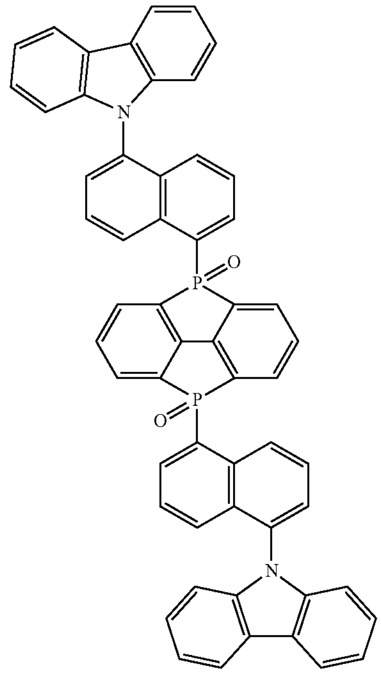
P30
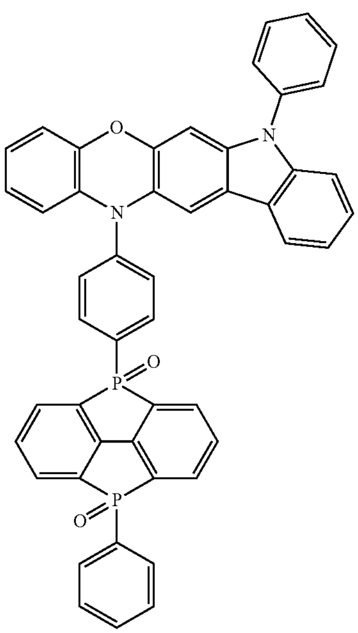
P31
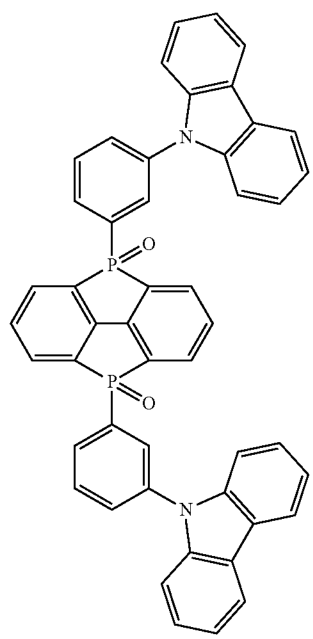

-continued
P32
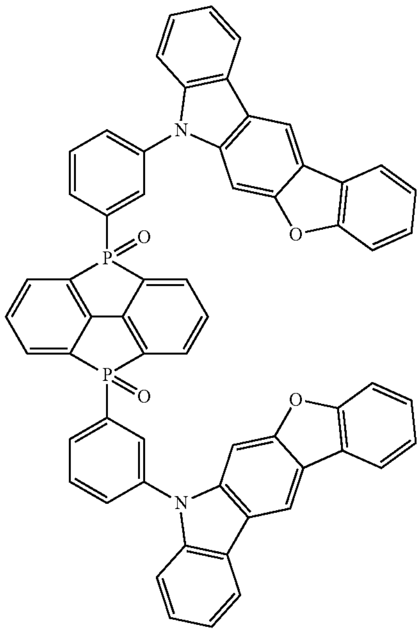
P33
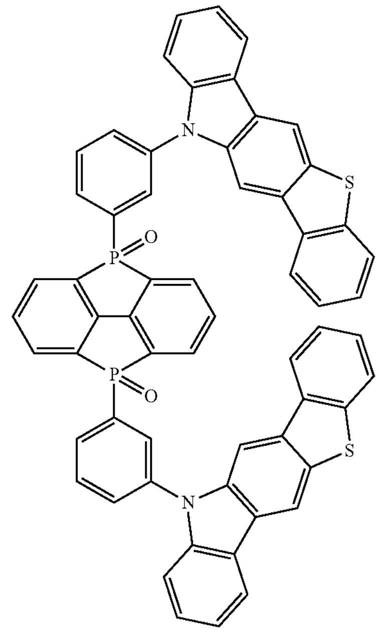
P34
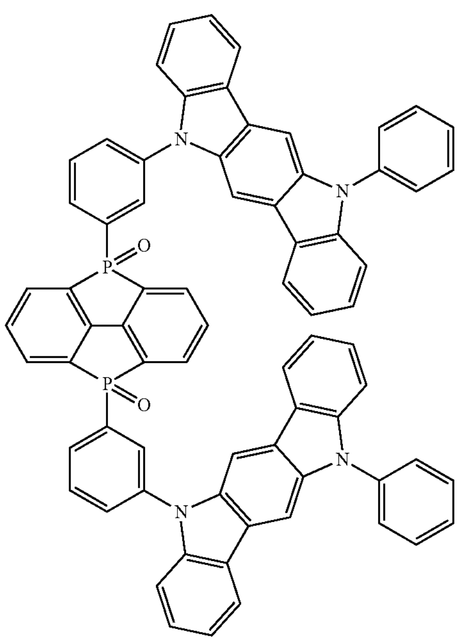
P47
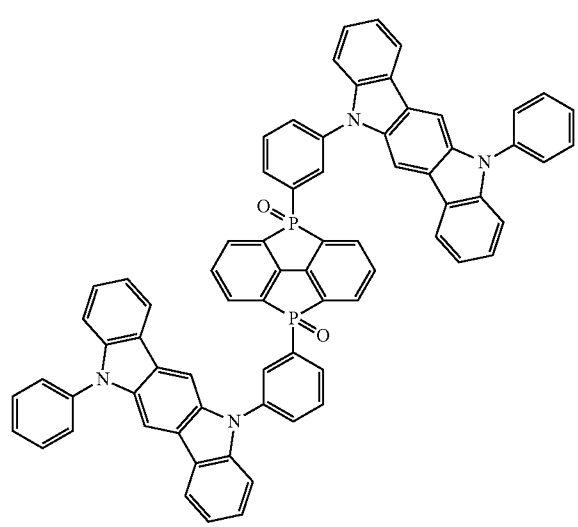

-continued
P48
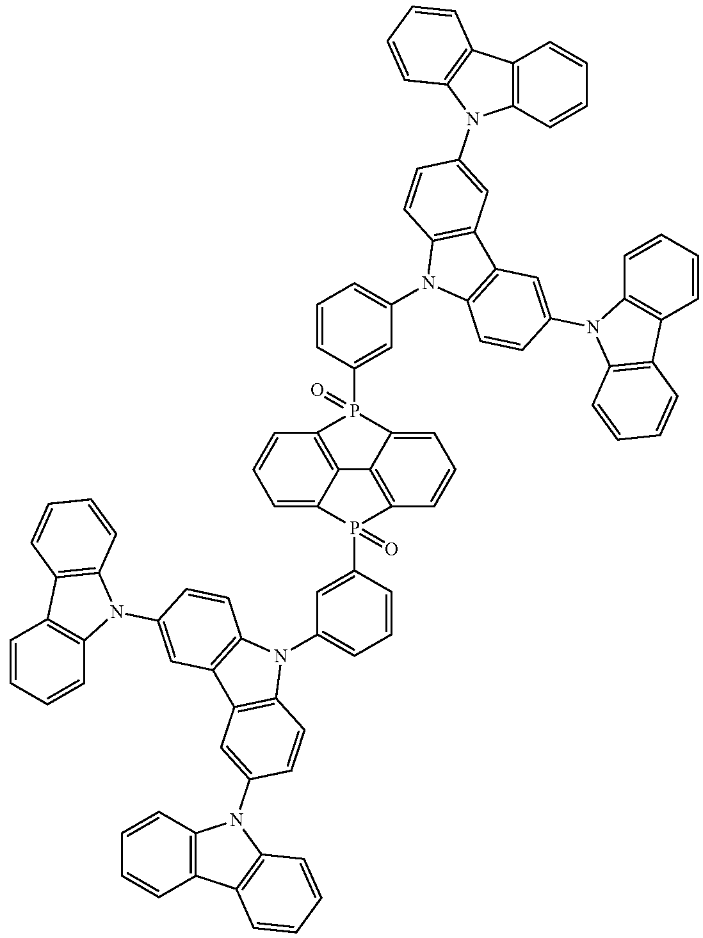
P49
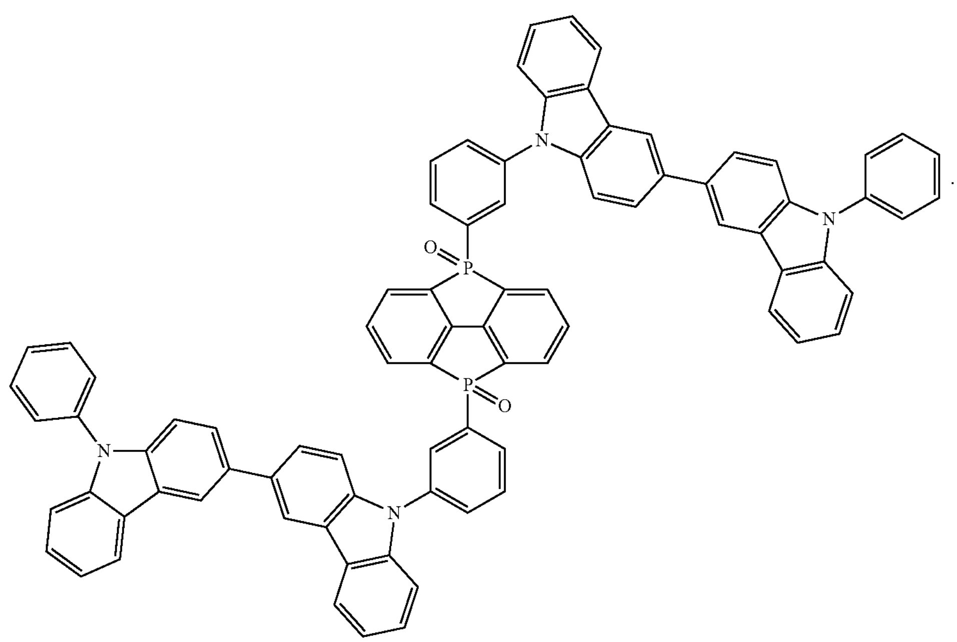

10. The compound according to claim 1, an energy level difference between the lowest singlet energy level S1 and the lowest triplet energy level T1 of the compound is ≤0.30 eV, i.e. $\Delta E_{st}=E_{S1}-E_{T1}\leq 0.30$ eV.

11. A method of manufacturing an organic optoelectronic device, comprising:

forming an organic thin film located between an anode and a cathode of the organic optoelectronic device using the compound according to claim 1.

12. An organic optoelectronic device, wherein the organic optoelectronic device comprises an anode, a cathode, and at least one organic thin film located between the anode and the cathode, and the organic thin film contains the compound according to claim 1.

13. The organic optoelectronic device according to claim 12, wherein the organic thin film further comprises a light emitting layer, and the light emitting layer contains the compound.

14. The organic optoelectronic device according to claim 13, wherein the compound is used as a host material, a doping material, or a co-doping material of the light emitting layer.

15. The organic optoelectronic device according to claim 12, wherein the organic thin film further comprises any one or a combination of at least two of a hole transport layer, a hole injection layer, an electron blocking layer, a light emitting layer, a hole blocking layer, an electron transport layer and an electron injection layer.

* * * * *